(12) United States Patent
Noguchi

(10) Patent No.: US 6,421,272 B1
(45) Date of Patent: Jul. 16, 2002

(54) NON-VOLATILE SEMICONDUCTOR MEMORY DEVICE

(75) Inventor: Mitsuhiro Noguchi, Kanagawa-ken (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/670,397

(22) Filed: Sep. 27, 2000

(30) Foreign Application Priority Data

Sep. 27, 1999 (JP) ............................................ 11-272332

(51) Int. Cl.$^7$ ............................................. G11C 16/04
(52) U.S. Cl. .............................. 365/185.05; 365/185.11; 365/185.17
(58) Field of Search ....................... 365/185.05, 185.11, 365/185.17

(56) References Cited

U.S. PATENT DOCUMENTS

| 5,043,947 A | * | 8/1991 | Oshima et al. | ........ | 365/230.03 |
| 5,473,563 A | | 12/1995 | Suh et al. | .............. | 365/185.13 |
| 5,959,887 A | * | 9/1999 | Takashina et al. | ..... | 365/185.13 |
| 5,969,988 A | * | 10/1999 | Tanzawa et al. | ....... | 365/185.23 |

FOREIGN PATENT DOCUMENTS

| JP | 7-182886 | 7/1995 |
| JP | 11-121721 | 4/1999 |

OTHER PUBLICATIONS

Koji Sakui et al.; "A Sophisticated Bit–by–Bit Verifying Scheme for NAND EEPROM's"; IEEE 1998 Symposium on VLSI Circuits Digest of Technical Papers; pp236–237.

K. Naruke et al.; "Semiconductor Device Engineering Laboratory"IEDM Technical Digest, 1988; pp. 424–427.

* cited by examiner

*Primary Examiner*—David Nelms
*Assistant Examiner*—Connie C. Yoha
(74) *Attorney, Agent, or Firm*—Finnegan Henderson Farabow Garrett & Dunner LLP

(57) ABSTRACT

The present invention relates to a non-volatile semiconductor memory device that is electrically rewritable. The device is provided with the first memory cell units 3 (a11, a12), respectively, installed at the intersection between the first data transfer lines 1 and a plurality of data selection lines 6, and provided with the second memory cell units (a21, a22), respectively, installed at the intersection between the second data transfer lines 2 and a plurality of data selection lines 6. Data writing latches 4 are connected to the data transfer lines 1. Switch elements 5 are inserted between the data transfer lines 1 and the data transfer lines 2. When the switches 5 are turned off in writing, one of the first data selection lines 6 to select the memory cell units a11, a12, and one of the second data selection lines 6 to select the memory cell units a21, a22 are simultaneously selected.

22 Claims, 18 Drawing Sheets

(a)
PRIOR ART (b)

NON-VOLATILE SEMICONDUCTOR MEMORY DEVICE

FIELD OF THE INVENTION

The present invention relates to a non-volatile semiconductor memory device, in particular, a non-volatile semiconductor memory device that can maintain its data holding characteristics even though the number of writing data is increased.

BACKGROUND OF THE INVENTION

A non-volatile semiconductor memory that can electrically rewrite has been proposed, using a MOS transistor of double-layered structure, which has a floating gate and a control gate. The semiconductor memory writes data by injecting electric charges from a channel through a floating gate via an insulation layer by a tunnel current. The injected electric charge is used as information storage of digital bits. It can read the information out by sensing a conductance change of a MOSFET responsive to the electric charge.

However, if, in the construction of the non-volatile semiconductor memory and by the method thereof, electric charge injection is repeated while increasing the current density in order to write data at a high speed, the abovementioned insulation film is deteriorated to increase the leakage current, and finally the data holding characteristics thereof may be worsened. The problem is described below with reference to FIG. 12 and FIG. 13.

FIG. 12 shows a memory cell matrix of a prior art non-volatile semiconductor memory and a circuit block of the major parts of the peripheries thereof.

In FIG. 12(a), reference numbers 1 and 1' indicate data transfer lines, 6 and 6' indicate data selection lines. These lines are disposed in the direction orthogonal to each other. Reference number 3 indicates a memory cell unit, and is provided at the intersections between the data transfer lines 1,1' and data selection lines 6,6'.

In FIG. 12(a), four memory cell units 3 are connected to each of data transfer lines 1,1', and two memory cell units are connected to each of data selection lines 6,6', thereby constituting a 2×4 memory cell unit matrix. Further, a latch 4 or 4', which provisionally holds written data is provided at one end of the respective data transfer lines 1,1'.

The latches 4,4' concurrently act as a sensing amplifier circuit to read out data of the memory cell units 3. Also, data lines 10,10' are connected to the latches 4,4' in order to transmit written and read data to a peripheral circuit and receive the same therefrom. In addition, the latches 4,4' are both connected to a signal line which establishes timing to latch data. In this structure, memory cell units a11, a12 a21, a22, connected to one data transfer line such as data transfer line 1 mean memory block.

And, as shown in FIG. 12(b), a clock generation circuit 11, which adequately executes the timing and output a signal thereof is provided at the signal line 9 and data selection lines 6,6'. Also, hereinafter, in compliance with the practice, the direction along the data selection lines 6,6' is called a "column", and the direction along the data transfer line 1 is called a "row".

In a prior art circuit shown in FIG. 12, where data are written in the memory cell units a11 and b11, it is necessary to apply an electric potential to the data transfer lines 1,1' to which the memory cell units a11 and b11 are connected. Therefore, the output voltage of the data latches 4,4' is adjusted so as to become a voltage value responsive to writing data. At the same time, a program voltage Vpgm that has a larger potential difference than the potential of the data transfer line in which writing is carried out is applied to the data selection line 6. At this time, the program voltage Vpgm is applied so that a high voltage enough to cause an electric current to flow in the abovementioned insulation film (the gate insulation film of the MOSFET) of a memory element located in the memory cell unit 3 is applied. At this time, the program voltage Vpgm is made pulse-like while having a sufficient duration of time of carrier injection.

In this case, it is requested that data of the memory cell unit a11 is not erroneously written in a non-selected memory cell unit, for example memory cell unit a21, connected to the same data transfer line 1 as that of the memory cell unit a11. Therefore, it is necessary that the potential of the data selection line 6 connected to the non-selected memory cell unit a21 approaches the potential of the data transfer lines 1,1' further than the abovementioned program voltage Vpgm. Accordingly, it is impossible to write optional data in memory data of a plurality of columns. That is, the number of lines in which data can be written per program pulse is one column.

FIG. 13 shows a flowchart of the non-volatile semiconductor memory, including a verification motion that can carry out writing of data in a plurality of columns, for example, two columns.

A sequence of writing data in memory cell units a11, b11 of the first column is comprised of a step (S1) for loading data to be written in the first column in the latches 4,4', a step (S2) for applying a program pulse to the data selection line 6, to which the memory cell units a11 and b11 of the first column is connected, a step (S3) for storing the result of judgment of a threshold of the memory cell units from and in which the data of the first column is read and written, into the data latches 4,4', a step (S4) for judging the result of judgment about whether or not writing is completed in all the memory cell units of the first column, and a step (S5) for re-establishing a program pulse voltage and a pulse width in a case where the result of the judgment in the step S4 is No. Also, hereinafter, the sequence in which only the column differs is expressed with a dash (') attached.

Therefore, in a case where data are written in a plurality (for example, n columns) of memory cell units, it is necessary to carry out the same sequence as the abovementioned sequence from S1 through S5 "n" times in time series as described in steps S1' through S5'. In this case, where it is assumed that the times necessary for motions in S1, S2, S3, and S4 are TS1, TS2, TS3 and TS4, the time required to write all the data is at least n×(TS1+TS2+TS3+TS4). Therefore, if the number of columns is increased "n" times, the writing time is accordingly increased "n" times.

Herein, in order to decrease the time required to write all the data, there is a method of decreasing the program time TS2 that takes most time. But, if, with respect to an electric charge required to write, the writing current is increased, low field leakage of the tunnel insulation film is increased further than the writing current is decreased by lengthening the program time (K. Naruke, 1988, IEEE Technical Digest IEDM p.424).

Also, if a silicon oxide film is used as a gate insulation film of the memory element, there arises another problem that a stress leakage current flows to the gate insulation film. When writing, the gate insulation film may receive a larger field stress than 10 MV/cm in order to flow an FN tunnel current to. By receiving the field stress, a leakage current flows at a low field that is, for example, 5 MV/cm or less.

The leakage current may be increased further than the value that can be presumed by the FN tunnel current. This is a stress leakage current.

For this reason, in a non-volatile semiconductor memory in which data are repeatedly written and deleted, a leakage current flow since an electric field resulting from electric charge accumulation is applied between a floating gate and a substrate in a state where an electric charge is held, and the electric charge is liable to disappear. In a non-volatile semiconductor memory, it is requested that information is retained and held in a high temperature of at least 85° C. for ten years, it was necessary to prevent the electric charge from disappearing with no power source provided.

SUMMARY OF THE INVENTION

As described above, in a non-volatile semiconductor memory of prior art structure, where data are written in a plurality of columns, there was a problem that the data writing time was greatly increased. Also, increasing current of writing data in order to speed up the data-writing make the stress leakage current increase, resulting in a problem of worsening the data holding characteristics of a memory.

The invention was developed in view of solving the problems, and it is therefore an object of the invention to provide a non-volatile semiconductor memory device that improves the data writing speed, and at the same time, can prevent the data holding characteristics from being worsened.

In order to solve the problems, the present invention provides a non-volatile semiconductor memory device comprising:

a first data transfer line;

a plurality of a first memory cell unit having a non-volatile semiconductor memory cell, connected to the first data transfer line;

a first data selection line connected to the each first memory cell unit;

a second data transfer line;

a plurality of a second memory cell unit having a non-volatile semiconductor memory cell, connected to the second data transfer line;

a second data selection line connected to the each second memory cell unit;

a data holder connected to the first data transfer line;

a switching element inserted between the first transfer line and the second data transfer line;

wherein, when writing data, the switching element is shut off, and one of the first data selection lines and one of the second data selection lines are simultaneously selected.

It is preferred that the transfer line and the data selection line are disposed orthogonal to each other and one row of a memory block having the memory cell units and the switching element connecting to the first transfer line is juxtaposed in a plurality rows in the direction of the data selection line and a memory matrix composed of the rows of the memory block and a control line disposed to connect to the switching element in parallel to the selection data line is further comprised.

It is preferred that the data holder contains a flip flop formed by a semiconductor element.

It is preferred that the data holder is provided with a plurality of circuits which provisionally hold written data.

It is preferred that the memory cell unit includes a field effect transistor provided with at least an electric charge accumulating layer and a control gate.

It is preferred that the field effect transistor uses an FN tunnel current for writing.

It is preferred that wherein the electric charge accumulating layer contains polysilicon or silicon nitride film.

It is preferred that the memory cell unit is composed of a NAND cell unit having a plurality of memory cells connected in a series.

It is preferred that a data holder connected to the second data transfer line is further comprised and the second data holder connected to the second data transfer line is composed of a fewer number of transistors than that of the data holder connected to the first transfer line.

It is preferred that the data holder connected to the first data line is composed of a sensing amplifier.

The present invention provides a non-volatile semiconductor memory device comprising:

a data transfer line;

a first memory cell unit and a second memory cell unit having a non-volatile semiconductor memory cell, connected to the data transfer line;

a first data selection line connected to the first memory cell unit;

a second data selection line connected to the second memory cell unit;

a data holder connected to the first data transfer line;

a first switching element inserted between the first transfer line and the first memory cell unit;

a second switching element inserted between the second line and the second memory cell unit;

wherein, when writing data, at least one of the fist switching element and the second switching element is shut off, and the first data selection line and the second data selection line are simultaneously selected.

It is preferred that the data transfer lines and the data selection lines are disposed orthogonal to each other and one row of a memory block having the memory cell units and the switching element connecting to the transfer line is juxtaposed in a plurality rows in the direction of the data selection line and a memory matrix composed of the rows of the memory block and a control line disposed to connect to the switching element in parallel to the data line is further comprised.

It is preferred that the first switching element and the first memory cell unit are formed on the same well, and the second switching element and the second memory cell unit are formed on the same well.

It is preferred that the data holder contains a sensing amplifier.

It is preferred that the data holder is made up of a flip flop formed by a semiconductor element.

It is preferred that the memory cell unit includes a field effect transistor provided with at least an electric charge accumulating layer and a control gate.

It is preferred that the field effect transistor uses an FN tunnel current for writing.

It is preferred that the electric charge accumulating layer contains polysilicon or silicon nitride film.

It is preferred that the memory cell unit is composed of a NAND cell unit having a plurality of memory cells connected in a series.

It is preferred that the data holder is provided with a plurality of circuits which provisionally hold written data. uses an FN tunnel current for writing motions.

According to the invention, a switching element is inserted between the first data transfer line and the second data transfer line that are separated from each other, and by turning off the switching element when programming, it becomes possible to select one of the first data selection lines and one of the second data selection lines at the same time in writing data.

Therefore, in a case of writing data in a plurality of columns, the time of writing data can be decreased to half without changing the writing time per memory cell unit. In a case where the number of dividing the data transfer lines is further increased, the data writing data can be reduced to one-(the number of dividing the data transfer lines)th at maximum. Accordingly, it is possible to write data at a higher speed, wherein consumption power of program pulses can be reduced. It is especially effective in a device, the writing speed of which is slow, like an EEPROM of a double gate structure.

Also, all the data writing time can be shortened by increasing the number of dividing columns, whereby it is possible to lengthen the writing time per cell. Thereby, the data writing current to write the same electric charge amount can be decreased, whereby it is possible to prevent the stress leakage current that causes consumption power to increase, and causes the data holding characteristics to be worsened.

Further, since it is possible to reduce the stress leakage current, the gate insulation film of a non-volatile semiconductor element can be further thinned, and the programming voltage in writing can also be decreased. Therefore, the area of a booster circuit to generate the programming voltage can be reduced, and the area of transistors can be reduced. Accordingly, chip area can be further decreased. Still further, power consumption can be decreased in line with a lowering of the programming voltage.

Also, in comparison with a case where a sensing amplifier is formed with respect to the respective separated transfer lines instead of a switching element as the data transfer line switch, the number of transistors can be reduced, and the circuit occupied area can also be reduced.

Still further, such a construction that does not require any power source line may be employed as the switching element. No wiring layer and contact are required to wire the power source in the memory matrix area, and it is possible to form a circuit with the same wiring construction as that of the prior arts.

In addition, since a plurality of circuits which provisionally hold written data are formed in respective sensing amplifiers, a data-transfer speed is faster and the wiring of the structure is shorter than the structure that transmits data from the peripheral data buffer to the sensing amplifiers from time to time in writing. So, the consumption power can be further decreased.

As described above, according to the invention, it is possible to reduce the data writing time by 1/(the number of divisions of a data transfer line) at maximum without changing the writing time per cell in a case of writing data in a plurality of lines. Therefore, higher speed writing can be carried out, and it is possible to reduce consumption power to form a program pulse.

Also, the total data writing time can be decreased by increasing the number of divisions of columns, whereby the writing time per cell can be lengthened. Therefore, the data writing current to write the same electric charge can be decreased, it is possible to prevent the device from deteriorating due to stress leakage, consumption power from increasing, the data holding properties from being worsened.

Further, since the stress leakage can be reduced, it is possible to further thin a tunnel insulation film of a memory cell, and the program voltage in writing can be reduced. Accordingly, since the area of a voltage boosting circuit to generate a program voltage can be reduced, and a small transistor only durable to the lower program voltage can be used, a chip area can be further reduced.

Also, in comparison to a case where a sensing amplifier is used for the respective divided data transfer lines instead of the data transfer line switches, the number of transistors can be decreased, resulting in a decrease in the circuit area. Still further, since the data transfer line switches can use a construction that does not need power source wires, no wiring layer and contact are required in the memory matrix area for power source wiring, wherein circuits can be constructed in the same wiring configuration as that of prior art examples. Further, a plurality of circuits that provisionally hold writing data are formed in the respective sensing amplifiers. Therefore, this is higher in speed than in a case where data are transferred from a peripheral data buffer to sensing amplifiers from time to time when executing writing, and the wiring length thereof is shorter. Therefore, consumption power can be reduced.

BRIEF DESCRIPTION OF THE DRAWINGS

FIGS. 15a–15b are to explain a modified version of the invention, wherein (a) is a sectional view taken along the line B–B' in FIG. 14, (b) is a sectional view taken along the line A–A' in FIG. 14, FIGS. 16a–16c are to explain a modified version of the present invention, wherein

DETAILED DESCRIPTION OF EMBODIMENTS

Hereinafter, a detailed description is given of a preferred embodiment of the invention with reference to the accompanying drawings.

(Embodiment 1)

Figure 1:
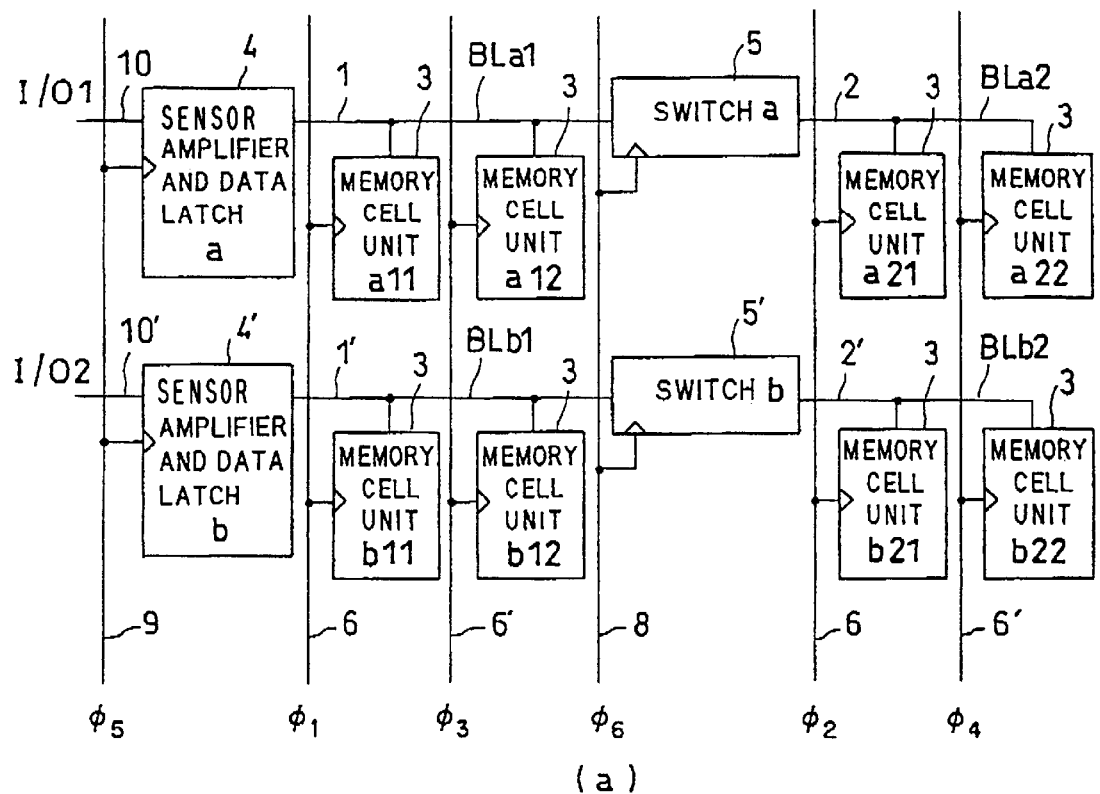
FIG. 1 is a block diagram showing a circuit configuration of a non-volatile semiconductor memory according to the first embodiment.

FIG. 1 is a block diagram showing a non-volatile semiconductor memory according to a first embodiment of the invention, wherein, in particular, (a) shows a circuit configuration of a memory cell matrix and its surrounding major portions, and (b) shows a block generation circuit.

FIG. 1 is different from the prior art example in that a data transfer line is divided into a plurality in the series direction and a data transfer line switch $5a,5a'$ is provided between the divided data transfer lines. In FIG. 1, reference numbers 1,1' and 2,2' indicate data transfer lines. Also, in this case, reference number 6 indicates a data selection line by which writing is carried out, and the data selection line 6' indicates a data selection line by which no writing is executed. These data selection lines are, respectively, disposed in directions orthogonal to the data transfer lines 1,1', and 2,2'.

Reference number 3 indicates memory cell units made up of a non-volatile memory cell of a double gate structure. The memory cell units are, respectively, formed at the intersections between the data transfer lines 1,1' and 2,2' and the data selection lines 6,6'. Control input with respect to the memory cell units is connected to the data selection lines 6,6'. Data input/output terminals of the memory cell units 3 are connected to the data transfer lines 1,1',and 2,2'.

In FIG. 1, two memory cell units 3 are connected to one data transfer line 1,1,2, or 2', and two memory cell units 3 are connected to one data selection line 6 or 6'.

Herein, memory cell units a11 and a12 correspond to the first memory cell units described in claim 1, and memory cell units a21 and a22 correspond to the second memory cell units therein. And, a data transfer line 1 that connects the first memory cell units a11 and a12 is the first data transfer line, and a data transfer line 2 that connects the second memory cell units a21 and a22 is the second data transfer line. A data selection line 6 that connects the first memory cell units a11 and a12 is the first data selection line, and a data selection line 6 that connects the second memory cell units a21 and a22 is the second data selection line. Also, the memory cell units a11, a12, b11 and b12 constitute a memory cell block 100, and the memory cell units a21, a22, b21 and b22 constitute a memory cell block 200. The memory cell units a11 and a12 constitute a memory sub block and the memory cell units a21 and a22 constitute a memory sub block. The memory cell units b11 and b12 constitute a memory sub block and the memory cell units b21 and b22 constitute a memory sub block. These memory cell block are juxtaposed in the direction of the data selection line 6. A memory matrix composed of these memory block.

In the preferred embodiment, an example in which two memory cell units 3 are connected to the data transfer line 1, 2, 1', 2' and two memory cell units 3 are connected to the data selection line 6, 6' is illustrated. However, the number of memory cell units to be connected to the data transfer line and data selection line may be any plural number, wherein it is preferable in view of address decoding that the number of cell blocks is $2^n$ (n: a positive integer). And, the number of data transfer lines and data selection lines may be any plural number, wherein it is preferable in view of address decoding that the number is $2^n$ (n: a positive integer).

Data writing latches 4,4' that provisionally hold written data are, respectively, connected to one end of the data transfer line 1 or 1'. Usually, the latches 4,4' are concurrently used as sensing amplifier circuits to read out data of the memory cell unit 3. Also, data lines 10,10' that transmit written data and read data to a peripheral circuit and receive the same therefrom are, respectively, connected to the latches 4,4'. Still further, a control signal line 9 that establishes the timing of latching the data is also connected to the latches 4,4'. One of the input/output terminal of the data transfer line switches 5,5' is connected to the other end of the data transfer line 1 or 1', that is, one end where no latches 4,4' are formed. One end of the data transfer line 2 or 2' is connected to the other end of the input/output terminal of the data transfer line switches 5 or 5'. In addition, a control signal line 8 is connected to the data transfer line switches 5,5', and the control signal line 8 controls connection between the data transfer line 1 and the data transfer line 2, and connection between the data transfer line 1' and the data transfer line 2'.

Also, a clock generation circuit 11 that adequately outputs a signal to adjust the timing is provided in the respective signal lines 8, 9 and data selection lines 6,6'. The circuit 11 adjusts the timing with respect to the memory cell units 3 connected to the data selection line 6', which is not selected in this case, so as to prevent erroneous writing and erroneous reading from occurring and to prevent the data from being destroyed. In addition, hereinafter, according to the actual practice, the direction along the data selection line 6 is called a "column", and the direction along the data transfer line 1 is called a "row".

In the preferred embodiment, by turning off the data transfer line switches 5,5' when writing data, it is possible to independently apply the potential of the data transfer lines 1,1', and potential of the data transfer lines 2,2' in compliance with the writing data. Therefore, it is possible to write data in the memory cell units 3 connected to the data transfer lines 1,1' and data transfer lines 2,2' simultaneously with respect to the number of dividing the data transfer lines. In this case, by one program pulse, it can write out simultaneously in two memory cell units, for example, the memory cell unit a11 and the memory cell unit a21.

Figure 2:
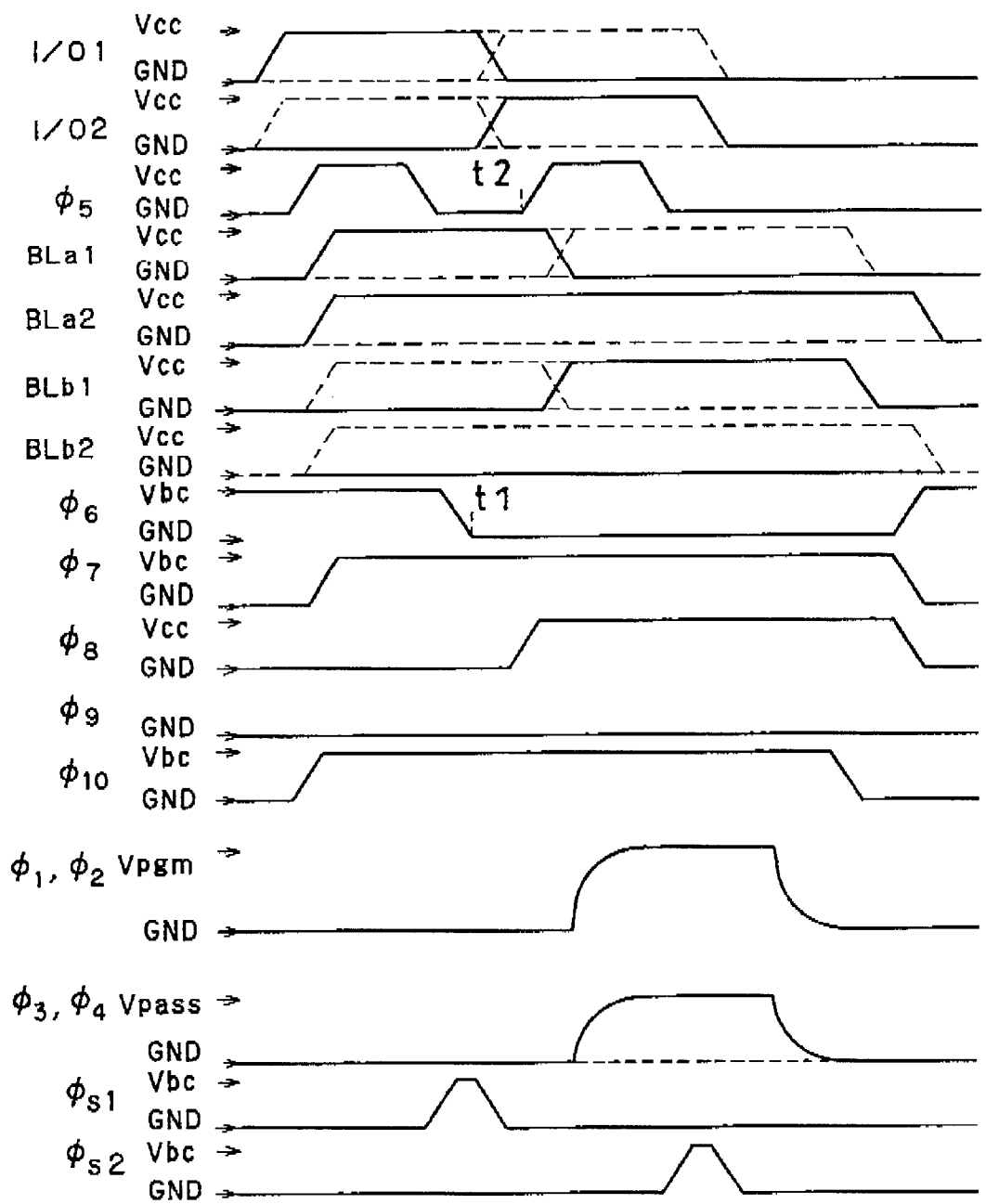
FIG. 2 is a timing diagram in a case of writing data in two columns by the configuration of the first embodiment.

FIG. 2 is a view of timing in a case where data are written in a plurality of columns, for example, two columns, of the embodiment shown in FIG. 1. In FIG. 2, to simplify the illustration, a description is given of a case where no verification is provided. Also, hereinafter, the ON state of a transistor means that a larger voltage than the threshold of the transistor is applied onto the gate electrode, and the MISFET source electrode and the drain electrode are electrically connected state. Also, the OFF state of a transistor means that a smaller voltage than the threshold of the transistor is applied to the gate electrode, and the MISFET source electrode and drain electrode are not in a conductive state.

In addition, the threshold is made into a gate voltage occurring when the current flowing the source electrode and drain electrode becomes a value that is, for example, 40 nA×(channel width)/(gate length). Also, in the embodiment, a description is given, using a transistor whose threshold is positive, as an example, because the construction of a usual CMOS logic circuit is simple. Unless otherwise specified, it is assumed that the circuit is turned on (ON state) where positive voltage that becomes, for example, Vcc in a range from 0.5V to 15V is applied as a control voltage, and the circuit is turned off (OFF state) where a voltage GND that becomes, for example, 0V is applied as the control voltage. As a matter of course, even though a transistor whose threshold is negative is used, it may be devised that the threshold is included in a variable range of the gate voltage.

FIG. 2 shows a case where "0" is written in the memory cell unit a21, "1" is written in the memory cell unit b21, "1" is written in the memory cell unit a11, and "0" is written in the memory cell unit b11. In the prior art example, with respect to the pattern data in which the data applied to the memory cell units connected to the same data transfer line differ, at least two program pulses must be provided in a case of writing. So the writing takes more time by two times than in the present embodiment.

Hereinafter, "1" indicates a state where a carrier, for example, an electron is gradually injected into the floating electrode of the memory cell unit 3 to have the threshold increased. And, "0" indicates a state where the threshold remains lowered without injection of the carrier into the floating gate electrode of the memory cell units 3. Here, it is assumed that data in the memory cell unit in which writing is to be executed are erased by, for example, a method of pulling out electric charge of the floating gate electrode, and the memory cell unit is in the "0" state. By adequately using inversion of voltage, it is possible to easily inverse the conditions of "1" and "0".

First, in FIG. 2, voltage Vcc is applied to the peripheral current input/output terminal I/O1, and voltage GND is applied to the peripheral current input/output terminal I/O2. These voltages correspond to writing data into the memory cell unit a21 and memory cell unit b21, wherein Vcc is used as the voltage corresponding to the "0" data, and GND is used as the voltage corresponding to the "1" data. And, in FIG. 2, solid lines indicate the writing data while broken lines indicate the inversed writing data.

The preferred embodiment shows an example that, since it is possible to reduce the area due to a limited number of circuit components, when the voltage of the control signal line 9 is turned off (OFF state), that is, the voltage is set to GND, data are latched, and when the voltage is set to Vcc, the voltage of the data input/output line 10 is transmitted to the data transfer line 1 as it is. For example, an edge trigger type data latching circuit that latches data at the rise edge of the control signal line 9 may be used as writing latches 4,4'. In this case, the voltage of the data transfer lines is more stabilized at the voltage of the writing data even though the peripheral current input terminal I/O1 and I/O2 change.

First, Φ6 potential is made into Vbc to cause the data transfer line switches 5,5' to enter a conductive state. Next, boosting Φ5 voltage, the data of the peripheral current input/output terminals I/O1 and I/O2 are outputted to the data transfer lines BLa1 and BLb1. Thereafter, by lowering the Φ5 voltage, the data are latched. At this time, since the data transfer line switches 5,5' are turned on, both data transfer lines BLa2 and BLb2 have, respectively, the same potential as that of the data transfer lines BLa1 and BLb1. Here, when an n-type MISFET is used as the data transfer line switches 5,5', it is recommended in view of boosting the potential of the data transfer lines BLa2 to the Vcc that the Vbc is made into value which is greater than the sum of adding the threshold of the n-type MISFET to the maximum voltage Vcc of the data transfer line BLa1.

Next, after the data transfer lines BLa2 and BLb2 are waited to be charged or discharged to appointed potential Vcc or GND in writing, the Φ6 potential is made into GND and the data transfer line switches 5,5' are caused to be interrupted. The timing (t1) on which the interruption is carried out is determined prior to the timing (t2) of the control signal line 9 that transmits data voltage different from the data transfer lines BLa2 to the BLa1. So since the data transfer lines BLa2 and BLb2 are electrically floating, the voltage established before the interruption of the data transfer line switches 5,5' can be held or maintained.

Next, GND is applied to the peripheral current input/output terminal I/O1. Also, Vcc is applied to the peripheral current input/output terminal I/O2. The Vcc and GND are voltages corresponding to the data "1" and "0" written in the memory cell unit a11 and memory cell unit b11.

Next, by boosting the 45 voltage, data voltage of the peripheral input/output terminal I/O1 and I/O2 are transmitted to the transfer lines BLa1 and BLb1. By the sequences described above, the transfer lines BLa1, BLa2, BLb1, and BLb2 are, respectively, set to the voltage corresponding to the writing voltage.

Next, after waiting that the transfer lines BLa1 and BLb1 are charged to appointed potential in writing in the duration of time from, for example, 1 nano second to 1 micro second, voltage pulses are applied so that the potential of the data control line 6 connected to the memory cell units 3 in which data are written becomes the program voltage Vpgm. At this time, the potential of the data control line 6' in which no writing is carried out is made into Vpass by which the line 6' is not allowed to be selected.

Here, in order to finish writing at a practical speed which is 0.1 mil second or less, voltage enough to cause an FN current exceeding $10^{-4}$ A/cm$^2$ to flow to the tunnel insulation film is requested. For example, in a case of a silicon oxide film whose film thickness t is [nm], it is necessary to set the program voltage Vpgm to t[V] or more, wherein it is desirable to set the program voltage in a range from t[V] to 2.2 t[V] in view of obtaining a practical speed. Also, the voltage Vpass is set more than 0V but less than the program voltage Vpgm, and it is preferable that the Vpass is set to 0.6 Vpgm or less. Also, it is preferable in view of obtaining a practical speed that the pulse width of the writing voltage Vpgm becomes in a range from 1 micro second through 100 mil second.

After the data writing pulse is applied, Φ6 potential is made into Vbc to cause the data transfer line switches 5,5' to enter a continuity state. This enables a high speed reading of the data from the memory cell units 3 in a case where reading is subsequently performed.

Based on the sequence, data can be written in a plurality of memory cell units connected to one sensing amplifier (for example, a latch 4) by one program pulse.

As a detailed example of the memory cell units 3 in FIG. 1 are 1 bit. In that case, not only a structure in which the control electrode of an independent EEPROM memory cell is connected to the data selection line, and one of the source and drain electrodes is connected to the data connection line, but also a series-parallel structure shown in, for example, FIG. 3 may be used.

In FIG. 3(a), non-volatile memory cells M1 through M16 comprising MOS transistors having a floating gate electrode are connected in a series, and one end thereof is connected to the data transfer line BL via a selection transistor Q1. Also, the other end thereof is connected to the common source line marked with "SOURCE" via a selection transistor Q2. The selection transistors Q1 and Q2 are formed on the same well as that of the memory cells M1 through M16. The control electrodes of the respective memory cells M1 through M16 are connected to the data selection lines WL1 through WL16. Also, the control electrode of the selection transistor Q1 is connected to a selection line SL1, and the control electrode of the selection transistor Q2 is connected to a selection line SL2, thereby constituting a so-called NAND type memory cell array.

In FIG. 3(b), non-volatile memory cells M1 through M16 comprising a MOS transistor having a floating gate electrode are connected in parallel to each other, and one end of the source or drain electrode is connected to the data transfer line BL via a selection transistor Q1. Also, the other end of the source or drain electrode is connected to the common source line marked with "SOURCE" via a selection transistor Q2. Further, although being not illustrated in the drawing, the selection transistors Q1 and Q2 are formed on the same well as that of the memory cells M1 through M16. The control electrodes of the respective memory cells M1 through M16 are connected to the data selection lines WL1 through WL16. Also, the control electrode of the selection transistor Q1 is connected to a selection lineSL1, and the control electrode of the selection transistor Q2 is connected to a selection line SL2, thereby constituting a so-called AND type memory cell array.

In FIG. 3(c), two pairs of non-volatile memory cells M1 through M16 comprising a MOS transistor having a floating gate electrode are connected to each other, and one end of the source or drain electrode is connected to the data selection line BL via the selection transistor Q1. Also, the other end of the source or drain electrode is connected to the common source line marked with "SOURCE". And, although being not illustrated in the drawing, the selection transistors Q1 and Q2 are formed on the same well as that of the memory cells M1 through M16. The control electrodes of the respective memory cells M1 through M16 are connected to the data selection lines WL1 through WL16. In addition, the control electrode of the selection transistor Q1 is connected to a selection line SL1, thereby constituting a so-called DINOR type memory cell array.

Figure 3:
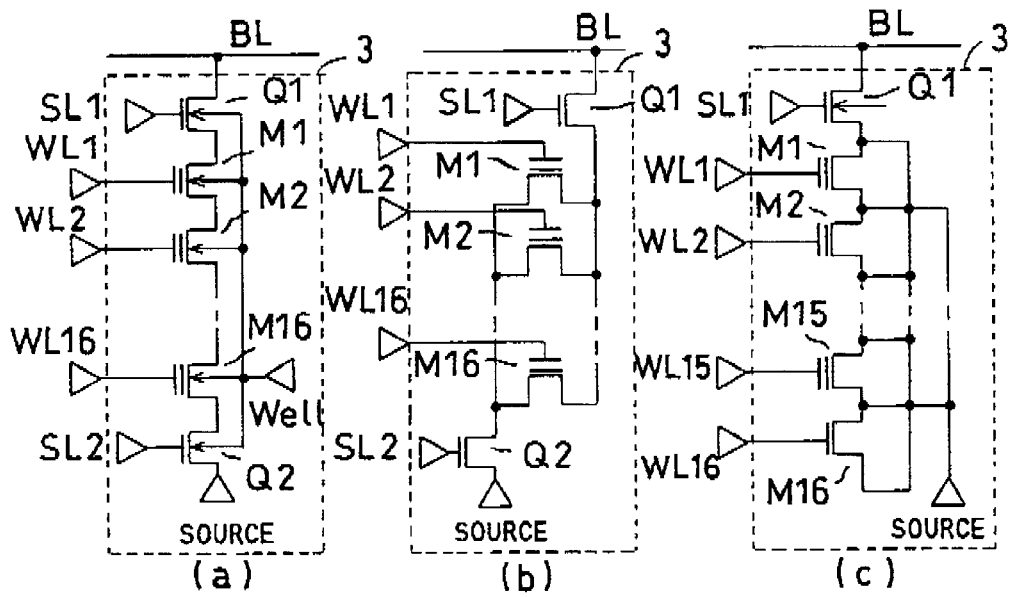
FIGS. 3a–3c are the circuit configuration showing a detailed example of a memory cell unit used for the first embodiment.

With respect to the detailed structure of the cells, it is possible to construct a memory cell unit 3 of FIG. 1, which has a structure as shown by dashed lines in FIG. 3 if one of the control electrodes WL1 through WL16 of the memory cells M1 through M16 is connected to the data control line.

FIG. 14(a) is a plan view of a NAND type memory cell unit, which shows a structure in which three memory cell units are juxtaposed. In particular, to make the cell structure clear, the view shows only the structure below a control gate electrode 27.

In FIG. 14(a), non-volatile memory cells comprising a MOS transistor having a floating gate 26 being an electric charge accumulation electrode are connected in series, wherein one end thereof is connected to the data transfer line via a selection transistor, and the other end thereof is connected to the common source line via a selection transistor. In addition, the control electrodes of the respective memory cells are connected to the data selection lines WL1 through WL16. Further, in order to select one memory cell unit from a plurality of memory cell units along the data transfer line BL and connect it to the data transfer line, the control electrode of the selection transistor S1 is connected to the unit selection line S1. In addition, the control electrode of the selection transistor S2 is connected to the unit selection line SL2, thereby constituting a so-called NAND type memory cell unit.

In the preferred embodiments, the control wires SL1 and SL2 of the selection gate are connected by memory cells adjacent to each other in the left and right directions of the paper by a conductor on the same layer as that of the electric charge accumulating layer of the control wires WL1 through WL6 of the memory cells. It is desirable in view of securing a high bit rate operation that the unit selection lines SL1 and SL2 are formed in the same direction as that of the data selection lines WL1 through WL16.

In the embodiment, an example is illustrated, in which 16 ($2^4$) memory cells are connected. However, it is acceptable that the number of memory cells which are connected to the data transfer lines and data selection lines is plural, and in view of address decoding, it is desirable to determine the number thereof which is 2n (n: a positive integer).

FIG. 15(a) is a view shown by the arrows B–B' in FIG. 14(a) and FIG. 15(b) is a sectional view taken by the arrows A–A'. Also, FIG. 15(a) is a cross-sectional view of the memory cell.

In FIG. 14(a), FIG.15(a), and FIG. 15(b), tunnel gate insulation films $25, 25_{SL1}$ and $25_{SL2}$ are formed on a p-type silicon area 23, and electric charge accumulation layers 26, $26_{SL1}$ and $26_{SL2}$ are formed on the tunnel gate insulation films $25, 25_{SL1}$ are $25_{SL2}$.

The p type silicon area may be such that, for example, the boron impurity concentration is from $10^{14}$ cm$^{-3}$ through $10^{19}$ cm$^{-3}$.

The tunnel gate insulation films $25, 25_{SL1}$ and $25_{SL2}$ may be made up of, for example, a silicon oxide film or an oxynitride film 3 nm through 15 nm thick, and the electric charge accumulation layers 26, $26_{SL1}$ and $26_{SL2}$ may be formed of, for example, polysilicon, to which phosphar or arsenic is doped at a ratio of $10^{18}$ cm$^{-13}$ to $10^{21}$ cm$^{-13}$, having a thickness of 10 nm through 500 nm.

The structure is formed so as to self-match the p-type silicon area 23 on an area where no element-separated insulation 24 comprising a silicon oxide film is formed. For example, after a tunnel gate insulation film 25 and an electric charge accumulation layer 26 are accumulated on the p-type silicon area 23, the p-type silicon area 23 is etched to a depth of, for example, 0.05 $\mu$m through 0.5 $\mu$m till reaching the p-type silicon area 23, and the structure can be formed by incorporating an element-separated insulation area 24.

Since the gate insulation film 25 and electric charge accumulation layer 26 are thus formed on the entire plane free from any gap, a film having uniform surface and excellent characteristics can be formed.

Unit insulation films 50, $50_{SL1}$ and $50_{SL2}$ are formed on the electric charge accumulation layer 26. The unit insulation films 50, $50_{SL1}$, and $50_{SL2}$ are composed of, for example, a laminated structure of a silicon oxide film or oxynitride film, or silicon oxide film/silicon nitride/silicon oxide film which are 3 nm through 30 nm thick.

Control gates 27 are formed on the unit insulation films 50, $50_{SL1}$, and $50_{SL2}$. The control gates 27 are made up of polysilicon to which impurities such as, for example, phosphor, arsenic, or boron is doped at a ratio of $10^{18}$ cm$^{-3}$ through $10^{21}$ cm$^{-3}$, or a laminated structure of WSi (tungsten silicide) and polysilicon, or a stacked structure of NiSi, MoSi, TiSi, CoSi and polysilicon. Also, the control gates 27 are 10 nm through 500 nm thick.

Also, the p-type silicon area (semiconductor area) 23 is constructed so as to be provided with voltage independently from a p-type semiconductor substrate 21 by an n-type silicon area 22. SO the load of a boosting circuit is reduced when erasing data, resulting in suppression of consumption power.

According to the embodiment, the electric charge accumulation layers 26 is deposited on the substrate and it forms a trench by etching. The insulation film 24 is formed in the trench. Therefor, since it takes adequate depth of the trench, the electric charge accumulation layers 26 is separated from p type silicon area 23 by the insulation film 24. So, it can prevent concentration of gate electric field and a parasitic transistor whose threshold is lower.

Further, since it is hard for the writing threshold to be lowered due to concentration of an electric field, that is, a sidewalk scarcely occurs, it is possible to form a transistor having further higher reliability.

As shown in FIG. 15(b), a sidewall insulation film 43 having a thickness of 5 nm through 200 nm, which is made up of a silicon nitride film or silicon oxide film, is formed on both sides of the electric charge accumulation layer 26. Also, an n-type diffusion layer 28 that becomes a source or drain area is formed at the position in which the electric charge accumulation layer 26 is interposed in the p-type silicon area 23. The source or drain area 28, the electric charge accumulation layer 26 and control gates 27 constitute a floating gate type EEPROM memory cell in which an electric charge amount accumulated in the electric charge accumulation layer (the floating gate electrode) 26 uses an information amount. It is better that the gate length is 0.01 μm or more or 0.5 μm or less.

The source or drain area 28 is an n-type silicon area in which, for example, phosphor, arsenic, or antimony is doped at a depth of 10 nm through 500 nm with its surface concentration of $10^{17}$ cm$^{-3}$ through $10^{21}$ cm$^{-3}$. Still further, the source or drain area 28 is commonly shared by memory cells adjacent thereto, thereby constituting a NAND connection.

Also, in the FIG. 3(a), the control gate electrodes $27_{SL1}$ and $27_{SL2}$ are, respectively, connected to the unit selection lines SL1 and SL2.

If the gate length of the electric charge accumulation layers $26_{SL1}$ and $26_{SL2}$ are determined to be, for example, more than 0.02 μm but less than 1 μm, a large ON/OFF ratio can be secured when selecting or not selecting the unit, whereby erroneous wiring or reading can be prevented from occurring.

In addition, an n-type diffusion layer 28d, which becomes a source or drain electrode formed at one side of the gate electrodes 27 (SL1), is connected to the source 33d via a data transfer line 36 (BL) and a contact layer 31d. The data transfer line 36 (BL) is made up of, for example, tungsten, tungsten silicide, titanium, titanium nitride or aluminum. The data transfer line 36 (BL) is formed to the unit boundaries in the up and down direction of the paper in FIG. 14(a) so that it is connected by the adjacent memory cell units.

An n-type diffusion layer 28s, which becomes a source or drain electrode formed at one side of the control gate electrode 27 (SL2), is connected to the source line 33 (SOURCE) via a contact 31. The Source line 33 (SOURCE) is formed to the unit boundaries in the left and right direction of the paper in FIG. 14(a) so that it can be connected by the adjacent memory cell units. As a matter of course, a source line may be established by forming the n-type diffusion layer 28s to the unit boundaries in the left and right direction of the paper.

The BL contact and SL contact can be made into a conductor area by filling polysilicon, tungsten, tungsten silicide, Al, TiN, Ti, etc., which are doped in the form of n-type or p-type. An inter-layered film 28 made of, for example, $SiO_2$ and SiN is filled up between the unit selection lines SL1, SL2 and the data transfer line BL or transistors. An insulation film protection layer 37 made of, for example, $SiO_2$, SiN or polyimide and an upper wire made of, for example, W, Al or Cu are formed on the upper part of the data transfer line BL.

Figure 16:
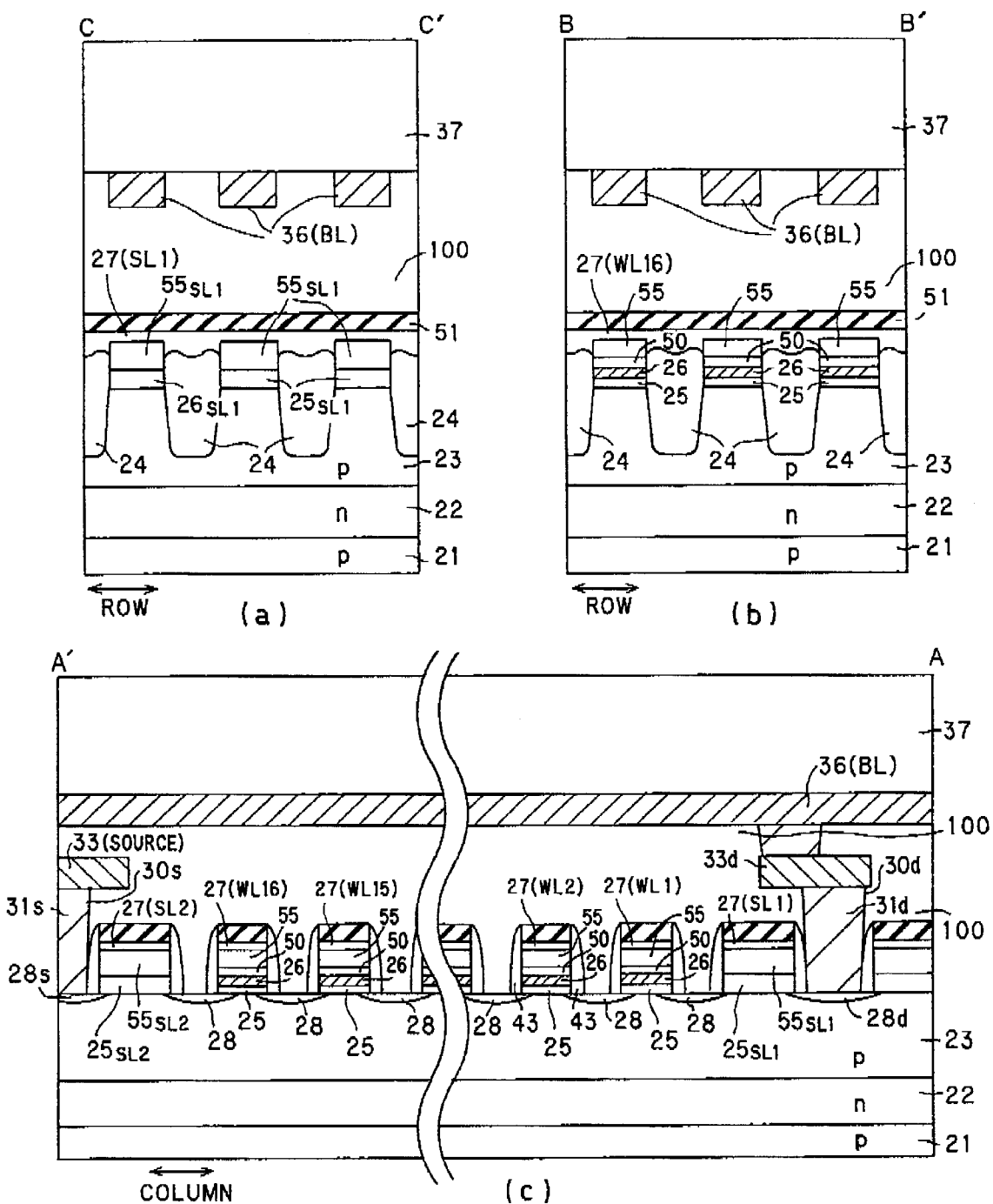
FIG. 16(b) and FIG. 16(c) are sectional views taken along the lines B–B' and A–A' of the NAND memory cell units corresponding to FIG. 15(a) and FIG. 15(b)
FIG. 16(a) is a sectional view of the data transfer lines (SL1) taken in the same direction.

FIG. 16 is a modified example of the preferred embodiment. This is such that a NAND memory cell unit using a floating gate is modified to a NAND memory cell unit using a MONOS type gate.

FIG. 16(b) and (c) are sectional views corresponding to B-B' and A-A' of the NAND memory cell unit, which, respectively, correspond to FIG. 15(a) and (b). Also, since the plan view is the same as that in FIG. 14(a), it is omitted. Still further, FIG. 16(a) is a sectional view of a unit selection line 27 (SL1) along the same direction as B-B'.

In FIG. 16, non-volatile memory cells comprising a MOS transistor of the electric charge accumulation layer 26 are connected in a series. One end thereof is connected to the data transfer line BL via a selection transistor while the other end thereof is connected to the common source line SL via a selection transistor. The electric charge accumulation layer 26 is made of SiN and SiON. The other end thereof is connected to the common source line marked with SL via a selection transistors Q1. Also, the selection transistors Q1, Q2 and memory cells M1-M16 (FIG. 3(a)) are formed on the same well.

In FIG. 16(a)(b)(c), the electric charge accumulation layer 26 is formed on the p-type silicon area 23 via the tunnel gate insulation film 25. The p-type silicon area 23 has a boron impurity concentration from, for example, $10^{14}$ cm$^{-3}$ to $10^{19}$ cm$^{-3}$. In addition, the tunnel gate insulation film 25 is made up of a silicon oxide film or oxynitride film whose thickness is, for example, from 10 nm to 10 nm. The electric charge accumulation layer 26 is made up of SiN or SiON whose thickness is, for example, from 3 nm to 50 nm.

A control gate 27 is formed on the electric charge accumulation layer 26 via an inter-layered insulation film 50. The electric charge accumulation layer 26 is, for example, 2 nm to 10 nm thick. Also, the inter-layered insulation film is made of a silicon oxide film. Further, the control gate 27 is of a stacked structure of polysilicon or WSi (tungsten silicide) and polysilicon or a stacked structure of NiSi, MoSi, TiSi, or CoSi and polysilicon, the thickness of which is, for example, from 10 nm to 500 nm.

The control gate 27 is formed to the unit boundary in the left and right direction of the paper so as to be connected by the adjacent memory cell units as shown in FIG. 14(a). The data selection lines WL1 through WL16 and selection gate control lines SL1 and SL2 are formed as shown in the drawing.

Also, voltage is applied to the p-type silicon area 23 by the n-type silicon area 22 independently from the p-type semiconductor substrate 21, whereby the load of the boosting circuit can be reduced when erasing data, and consumption power can be suppressed.

According to the embodiment, the electric charge accumulation layers 26 is deposited on the substrate and it forms a trench by etching. The insulation film 24 is formed in the trench. Therefore, since it takes adequate depth of the trench, the electric charge accumulation layers 26 is separated from p type silicon region 23 by the insulation film 24. So, it can prevent concentration of gate electric field and a parasitic transistor whose threshold is lower.

Further, a lowering of the writing threshold resulting from concentration of the electric field, that is, a sidewalk phenomenon scarcely occurs. Therefore, transistors having further higher reliability can be formed.

An insulation film 43 is formed at both sides of the floating gate electrode 26. The insulation film 43 is made up of a silicon nitride film or a silicon oxide film whose thickness is 5 nm through 200 nm. An n-type diffusion layer 28 that becomes a source or drain area is formed at the position in which the floating gate 26 interposed in the p-type silicon area 23. The source or drain area 28, the electric charge accumulation layer 26, and control gate 27 constitute a MONOSS type non-volatile EEPROM memory cell. The length of the electric charge accumulation layer 26 is determined to be more than 0.01 μm but less than 0.5 μm. In the n-type diffusion layer 28, for example, phosphor, arsenic, or antimony is diffused as impurities, and the n-type diffusion layer 28 is formed so as to have a surface concentration of $10^{17}$ cm$^{-3}$ through $10^{21}$ cm$^{-3}$ and a depth of 10 nm through 500 nm. The n-type diffusion layer 28 is NAND-connected with its memory cells connected in a series.

Also, the gate electrodes 27 (SL1) and 27(SL2) are, respectively, connected to the unit selection lines SL1 and SL2. The gate electrodes 27 are formed in the same layer as that of the control gate electrodes 27 (WL through WL16) of the MONOS type EEPROM. The gate electrodes 27 (SL1) and 27(SL2) face the p-type silicon area (p-type well) 23 via the gate insulation films $25_{SL1}$ and $25_{SL2}$, and constitute a MOS transistor. The gate insulation films $25_{SL1}$ and $25_{SL2}$ is made up of a silicon oxide film or an oxynitride film whose thickness is, for example, from 3 nm through 15 nm.

The length of the gate electrode $27_{SL1}$ and $27_{SL2}$ is longer than the gate length of the memory cell gate electrodes 27 (WL1 through WL16), and is, for example, more than 0.02 μm but less than 1 μm, whereby the ON/OFF ratio when selecting and not selecting the units can be established to be large, and erroneous writing and reading can be prevented from occurring.

Also, the n-type diffusion layer $28_d$ which becomes a source or drain area formed at one side of the gate electrode 27 (SL1) is connected to a data transfer line 36 (BL) via a contact $31_d$. The data transfer line 36 (BL) is made of, for example, tungsten, tungsten silicide, titanium, titanium nitride, or aluminum.

The data transfer line 36(BL) is formed to the unit boundaries in the up and down direction of the paper in FIG. 16(b) so that it is connected by its adjacent memory cell units. The n-type diffusion layer 28, which becomes a source or drain electrode formed at one side of the gate electrode 27 (SL2) is connected to a source line SL, which becomes a source line, via a contact $31_s$. The source line SL is formed to the unit boundary in the left and right direction of the paper of FIG. 16(a) so that it is connected by its adjacent memory cell units. As a matter of course, the source line may be established by forming the n-type diffusion layer 28s to the unit boundaries in the left and right direction of the paper. For example, polysilicon and tungsten, or tungsten silicide, Al, TiN, Ti, etc., which are doped in the form of n-type or p-type, are filled up to establish a conductor area as the BL contact and SL contact. Still further, an interlayered insulation film 28 made up of, for example, SiO$_2$ and SiN is inserted between the source line SL and data transfer line BL or transistors, whereby these are insulated.

In addition, an insulation film protection layer 37 made up of, for example, SiO$_2$, SiN, or polyimide, and an upper wire made up of, for example, W, Al and Cu are formed on the upper part of the data transfer line BL.

In the present modified version of embodiment, since an MONOS type memory cell is used in addition to the features of the first preferred embodiment, it is possible to lower the writing voltage and erasing voltage further than by the floating gate type EEPROM memory cell according to the first embodiment, and dielectric breakdown voltage resistance can be maintained even though the gate insulation film thickness is thinned by narrowing the space between separated elements. Therefore, since the area of circuits to which high voltage is applied can be made smaller, the chip area can be reduced. Further, in comparison to the first preferred embodiment, it is possible to reduce the thickness of the electric charge accumulation layer 26 to 20 nm or less, and the aspect can be lowered when forming gates. Accordingly, the shape of gate electrodes can be improved, and incorporation of interlayered insulation films 28 between gates can be further improved. And, the breakdown voltage can be still further improved.

Also, a process for forming the electric charge accumulation layers and a process for forming slits are no longer required. Therefore, the processing steps thereof can be decreased. In addition, since the electric charge accumulation layer 26 is made of an insulation body and electric charge is captured in respective electric charge traps, intensive resistance can be brought about with respect to radiant rays, by which electric charge is scarcely emitted. Further, since electric charge captured by the electric charge accumulation layer 26 is not emitted even though the side wall insulation film 43 of the electric charge accumulation layer 26 is thinned, a better holding characteristic can be maintained.

Figure 14:
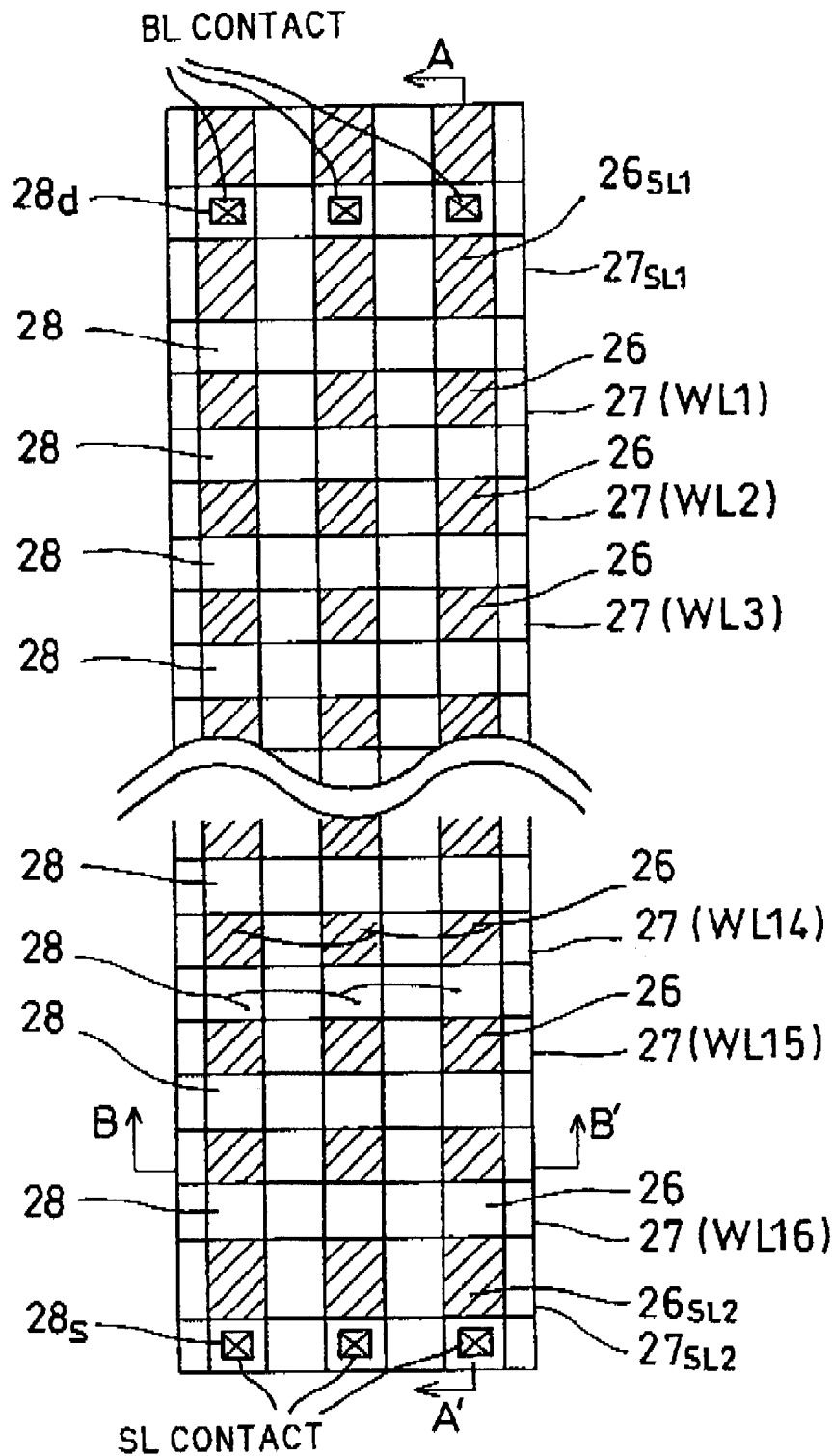
FIG. 14 is an upper surface view of a non-volatile semiconductor memory to explain a modified version of the invention.
Figure 15:
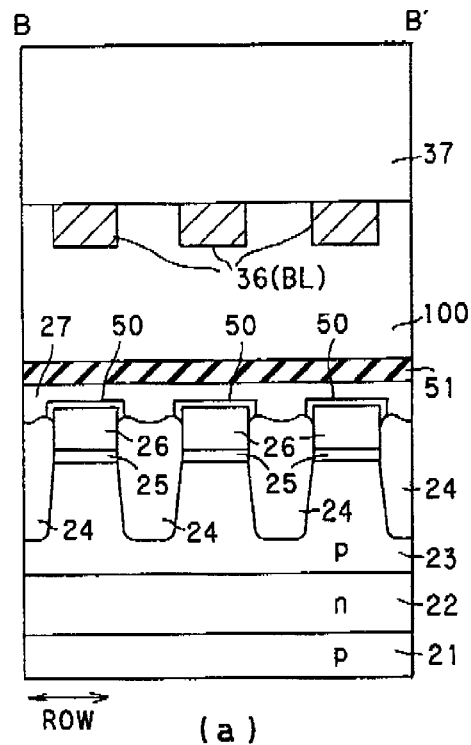
Figure 15:
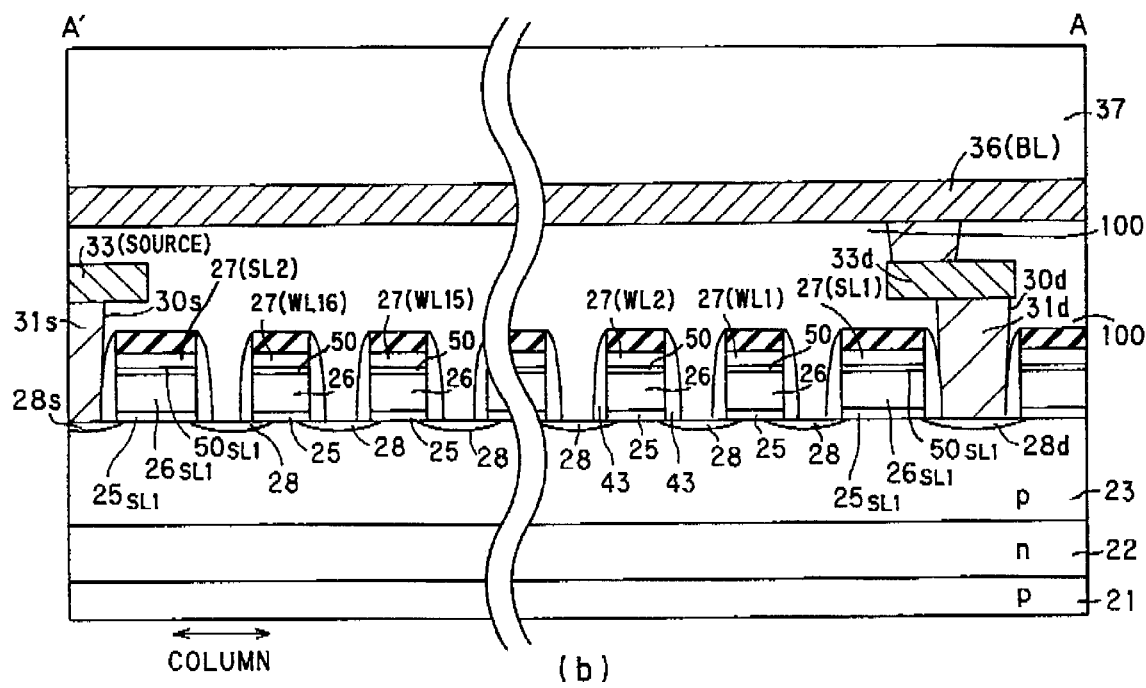
Figure 17:
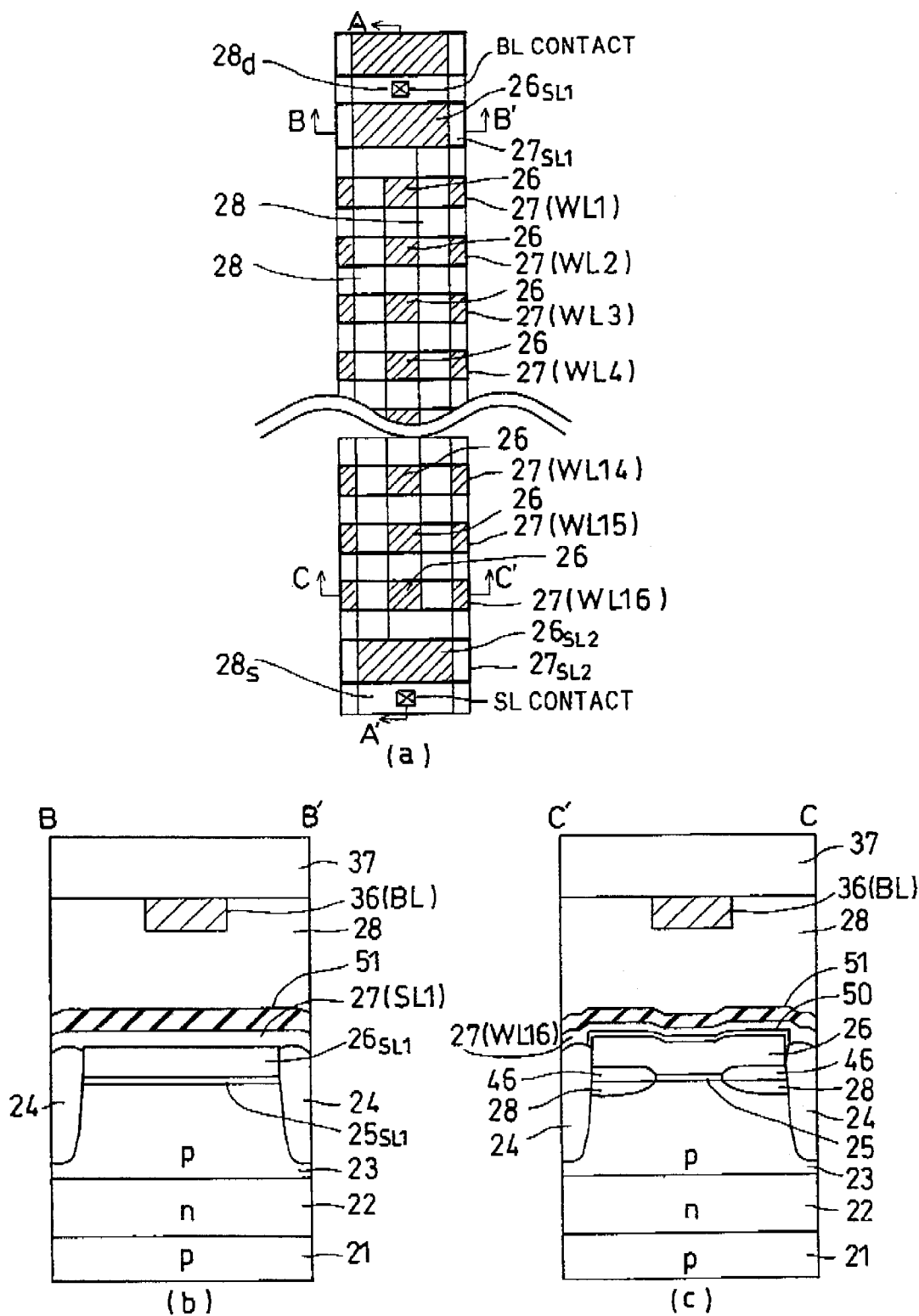
FIGS. 17a–17c are the view showing a modified version of the invention, wherein (a) is an upper surface view of a non-volatile semiconductor memory, (b) is a sectional view taken along the line B–B' in FIG. 17(a), and (c) is a sectional view taken along the line C–C' in FIG. 17(a).

FIG. 17 shows a plan view and a sectional view of a non-volatile memory according to another modified version of the embodiment of the invention. This modified version is such that the NAND memory cell units illustrated in FIG. 14 and FIG. 15 are altered to AND memory cell units. Also, the parts that are identical to those of the NAND memory cell units are given the same reference numbers, and the detailed description thereof is omitted.

FIG. 17(a) is a upper plane view of a non-volatile semiconductor memory showing a corresponding to the circuit diagram of an AND memory cell unit of FIG. 3(a). FIG. 17(b) is a sectional view taken along the line B–B' in FIG. 17(a), and FIG. 17(c) is a sectional view taken along the line C–C' in FIG. 17(a). In particular, in FIG. 17(a), in order to make the cell structure more understandable, only the structure that is lower than the gate electrode 27 is illustrated.

In FIG. 17(b) and FIG. 17(c), the electric accumulation layer 26 is formed on the p-type silicon area 23 via tunnel gate insulation films 25, $25_{SL1}$ and $25_{SL2}$. The tunnel gate insulation films 25, $25_{SL1}$ and $25_{SL2}$ are made up of a silicon oxide film or oxynitride film whose thickness is, for example, 3 nm through 15 nm. The electric charge accumulation layer 26 is made up of polysilicon, having a thickness of, for example, 10 nm through 500 nm, in which phosphor or arsenic is doped at a ratio of $10^{18}$ cm$^{-3}$ through $10^{21}$ cm$^{-3}$.

A unit insulation film 50 is formed on the electric accumulation layer 26. The unit insulation film 50 is made of a silicon oxide film or oxynitride film, or silicon oxide film/silicon nitride film/silicon oxide film, whose thickness is, for example, from 3 nm through 30 nm.

In order to produce the structure, the gate insulation film 25 and the electric accumulation layer 26 are formed on the p-type silicon area 23. Next, the trench may be formed by etching the gate insulation film 25 and floating gate 26 at a depth of, for example, 0.05 μm through 0.5 μm. The structure can be formed by burying the insulation film 24 in the trench. Since the gate insulation film 25 of the memory cell portion and the floating gate 26 can be produced to be flush almost free from gap, the films can be formed so as to have further improved uniformity.

In addition, the interlayered insulation film 46 of the memory cell portion, and n-type diffusion layer 28 can be formed so as to self-align by, for example, forming a masking material of polysilicon at a portion, in which a tunnel insulation film 25 is formed, prior to forming the tunnel insulation film 25, accumulating an interlayered insulation film 46 on the entire surface after forming an n-type diffusion layer by ion injection, and selectively removing the masking material by a CMP method (chemical mechanical polishing method) or etching back.

The control gate 27 is formed on the interlayered insulation film 46. The control gate 27 is composed of polysilicon or a stacked structure of WSi(tungsten silicide) and polysilicon, or a stacked structure of Cosi and polysilicon, whose thickness is, for example, from 10 nm through 500 nm. The control gate 27 is formed to the unit boundaries in the left and right direction of the paper so that it is connected by its adjacent memory cell units in FIG. 17(a), thereby forming data selection lines WL1 through WL16 and unit selection gate control lines SL1 and SL2.

Also, the p-type silicon area 23 is constructed so that voltage is applied independently from the p-type semiconductor substrate 21 by the n-type silicon area 22, whereby the load of the boosting circuit can be reduced when deleting data, and consumption power can be decreased.

As shown in FIG. 17(c), in the section C–C' corresponding to the memory cell, an n-type diffusion layer 28 which becomes a source or drain electrode is formed below the gate electrodes, so that the interlayered insulation film 46 is interposed. The interlayered insulation layer 46 is made up of a silicon oxide film or an oxynitride film whose thickness is, for example, from 5 nm through 200 nm. The n-type diffusion layer 28, electric charge accumulation layer 26 and control gate 27 constitute a floating gate type EEPROM memory cell in which an electric charge amount accumulated in the electric charge accumulation layer 26 is used as an information amount. The gate length is determined to be more than 0.01 μm but less than 0.5 μm.

As shown in FIG. 17(c), in view of preventing erroneous writing from occurring due to electric field concentration at the source or drain area 28 end, it is more preferable that the interlayered insulation film 46 is formed on the channel so as for the source or drain area 28 to be enclosed. The source or drain area (n-type diffusion area) 28 employs, for example, phosphor, arsenic, antimony as impurities and is formed at a depth from 10 nm through 500 nm so that its surface concentration becomes $10^{17}$ cm$^{-3}$ through $10^{21}$ cm$^{-3}$. Further, the n-type diffusion layer 28 is commonly shared by memory cells adjacent to each other in the direction of the data transfer line BL, thereby constituting an AND connection.

In addition, the gate electrodes 27 (SL1) and 27(SL2) are connected to the unit selection lines corresponding to the respective source lines SL1 and SL2.

As shown in FIG. 17(a) and FIG. 17(b), the unit selection transistor Q1 is a MOSFET comprising source or drain electrodes 28, 28$_d$ and a gate electrode 27 (SL1). The unit selection transistor Q2 is a MOSFET comprising source or drain electrodes 28, 28$_s$ and a gate electrode 27 (SL2).

The length of the gate electrodes 27 (SL1) and 27(SL2) is longer than the gate length of the memory cell gate electrode, and is determined to be, for example, more than 0.02 μm but less than 1 μm, whereby the ON/OFF ratio when selecting and not selecting units can be made larger, and erroneous writing and erroneous reading can be prevented from occurring.

In the example, since an AND memory cell is used as shown in FIG. 3(b), the series resistance of the memory cell units can be decreased and be fixed, and the example is suitable to stabilize the threshold in the case of multileveling.

Next, the data transfer line switch is explained.

Figure 4:
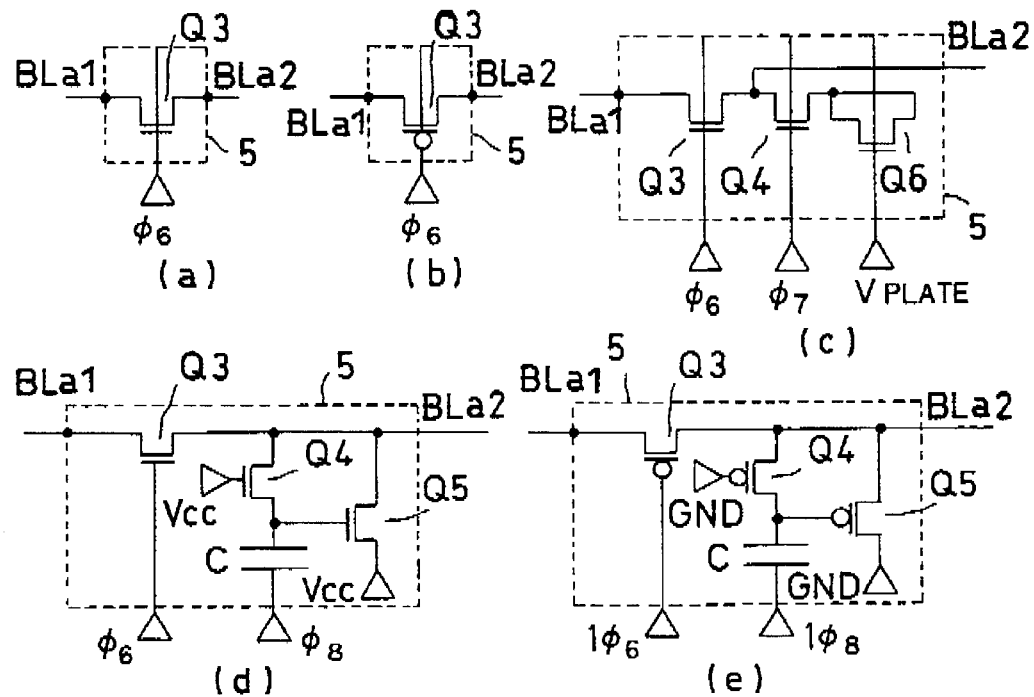
FIGS. 4a–4e are the circuit configuration showing a detailed example of a data transfer line switch used for the first embodiment.

FIG. 4 shows a detailed example of data transfer line switches 5,5'. In the drawing, BLa1 indicates a data transfer line at the side where a writing latch is connected, and BLa2 indicates a data transfer line at the side where the writing latch is not connected. Also, control voltage is applied to the portion marked with Φ6 at timing shown in FIG. 2.

As shown in FIG. 4(a), in the structure in which an n-type MISFET (Q3) is used, the current drive capacity is larger than in the p-type MISFET, wherein the switch circuit area can be made very small, and since the non-volatile memory cell is a normal n-type MISFET, well separation from the memory cell is not required. Still further, as shown in FIG. 4(b), a structure in which a p-type MISFET (Q3) is used may be acceptable. In this case, /Φ6 which is an inversion signal of Φ6 explained in FIG. 2 may be inputted, and it is not necessary to boost the gate electrode of Q3 more than Vcc. Therefore, this is suitable for low-voltage drive. Hereinafter, an inversion signal is expressed by attaching "/" thereto.

Also, in the example shown in FIG. 4(c), a dynamic type memory cell comprising transistor Q4 and the transistor Q6 is formed at the data transfer line BLa2 side in addition to the Q3 switch in FIG. 4. Herein, the transistor Q6 is a capacitor for holding electric charge, wherein it is preferable in view of increasing capacity that the dynamic type memory cell is formed of a depression type transistor. The capacitor composed of the transistor Q6 may not be formed of MISFET but may be formed of a normal capacitor. This is to reduce a fluctuation in voltage in the data transfer line when writing data in a memory cell connected to the data transfer line BLa2. The transistor Q4 is to control the timing of writing data in a capacitor formed of the transistor Q6.

Herein, in order to make the accumulation capacity larger with the transistor turned on, it is preferable that a plate voltage Vplate is determined to be between GND and VCC, and in particular to be Vcc. The capacity between the control gate of the non-volatile memory cell at a conductive state of the cell and a substrate is assumed to be Ccell, and the number of rows or columns of non-volatile memory cells in the memory cell unit 3 shown in FIG. 3 is assumed to be "n", wherein it is necessary that the capacity of Q6 is sufficiently larger than "n×Ccell", for example, larger by three or more times than the "n×Ccell".

As shown in FIG. 2, Φ7 timing is given Vbc potential after Φ5 becomes Vcc and writing potential is provided for the data transfer line BLa1. When the Vbc potential is given, the data transfer line switch 5 is in a continuity state, and Vcc or GND potential is applied to the output potential of the sensing amplifier and writing latch, and to the Q6 capacitor. Next, after a program pulse is applied, the Φ7 is changed from Vbc to GND. Herein, the Φ7 becomes GND in a reading state, whereby it is necessary that the additional capacity of the data line is decreased, the reading signal voltage and reading speed are increased.

In the example shown in FIG. 4(c), the set voltage in writing BLa2 is further stabilized than in FIG. 4(a), high-frequency noise is bypassed to Vplate and is smoothed by the Q6 capacitor. Therefore, sufficient resistance can be secured with respect to a potential increase when the Vpass is boosted due to capacitance coupling of the data selection lines, a electric charge loss due to leak current of bit lines, and further switching noise.

Also, in the example shown in FIG. 4(d), a so-called active restore circuit is formed at the BLa2 side by n-type MISFET Q4 and Q5 and a capacitor C in addition to the Q3 switch of FIG. 4. In order not to fluctuate "1" level data transfer line voltage by pulse application with respect to Φ8, it is preferable that the capacitor C is made sufficiently smaller in comparison to the capacity of the data transfer line.

As shown in FIG. 2, the Φ8 timing is devised so that it becomes from GND to Vcc after the data transfer line switch 5 is interrupted, and becomes VCC to GND after a program pulse is applied. Herein, where it is assumed that the threshold of the transistor Q4 is Vth, the transistor Q4 is turned off as the BLa2 potential becomes higher than Vcc-Vth where the Φ8 is GND, and the Q5 gate voltage becomes Vcc-Vth.

Thereafter, since the transistor Q4 is turned off as a Vcc pulse is added to Φ8, the gate voltage of the Q5 which is floating is boosted to 2Vcc-Vth, and the Q5 is turned on, whereby the BLa2 potential is charged to the Vcc. On the other hand, the BLa2 potential becomes lower than Vcc-Vth when the Φ8 is GND and becomes voltage lower than the threshold of Q5, Q4 enters a continuity state, wherein the Q5 voltage is fixed at the BLa2 voltage even though pulse voltage is applied to Φ8, and the Q5 does not enter a conductive state. Therefore, the voltage before and after a pulse voltage is applied becomes equal to each other.

That is, while a program pulse is being applied by the active restore circuit, the writing voltage of "0" level data transfer line BLa2 is boosted to fixed voltage which is Vcc, and even though the BLa2 potential is lowered due to conjunction leakage of a data transfer line, it is possible to prevent erroneous writing in "1" from occurring.

FIG. 4(e) is such that the circuit shown in FIG. 4(d) is replaced by a p-type MISFET. The actions of the circuit is the same as those of the circuit in FIG. 4(d), excepting that the polarities are inversed. Therefore, the description thereof is omitted. In the circuit, even though the data transfer line BLa2 potential is increased due to electron injection into a non-volatile memory cell and capacitance coupling of a program voltage pulse, the writing voltage of the "1" level the data transfer line BLa2 can be maintained at a fixed level of GND while a program pulse is being applied, and the potential that is applied to the tunnel insulation film is further fixed, and finally the writing current can be fixed. Therefore, even though a leakage current exists in the bit line, the writing speed can be further stabilized, and variation due to the cell characteristics can be reduced. Accordingly, the writing can be carried out at a high speed.

Figure 5:
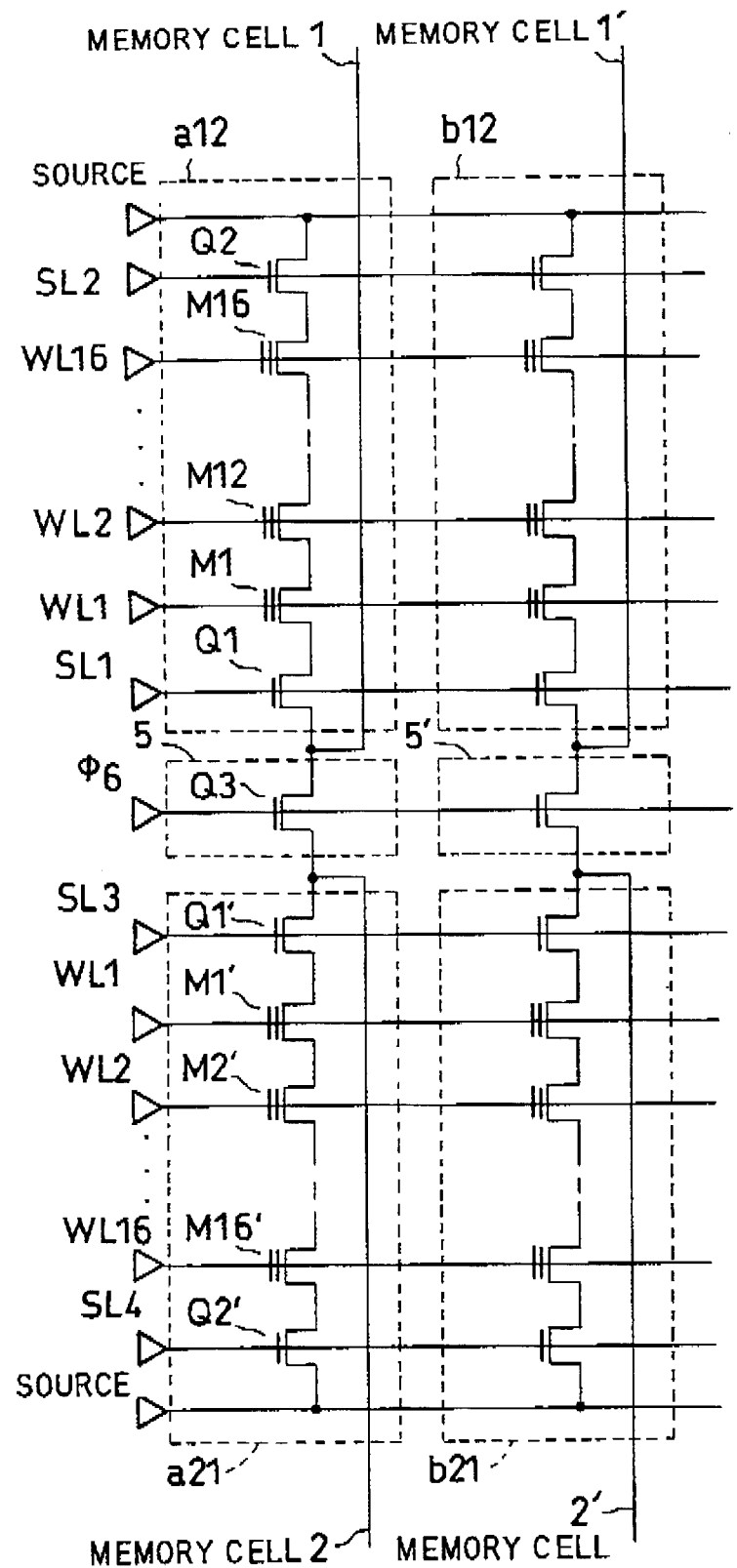
FIG. 5 is a view showing the upper layout side of memory cell units between which the data transfer line shown in FIG. 1 is interposed.

FIG. 5 indicates the upper layout side of the memory cell unit 3 in which data transfer switches 5, 5' of the preferred embodiment according to the invention is interposed. A NAND cell unit as shown in FIG. 3(a) was used as a memory cell unit 3. In the drawing, wire layers 1,1',2,2' other than the gate electrodes are indicated by thick solid lines. To make the drawing more understandable, the wire layers 1,1',2,2' are illustrated as they are somewhat shifted from memory transistors M1 through M16. Actually, however, the wire layers are formed orthogonal with the data selection lines in the perpendicular direction of semiconductor substrates of transistors M1 through M16.

The circuit shown in FIG. 4(a) is used as switches 5,5'. As shown in FIG. 5, the data control lines WL1 through WL16 of the memory cell units a12 and memory cell units b12 are formed in a plurality of rows in the direction orthogonal to the data transfer line and commonly shared. Still further, the gate control lines SL1 through SL4 of selection transistors in the memory cell unit are also shared, and formed in the same direction as that of the data control line. Thus, a memory cell unit may be disposed at all the intersections between the data transfer lines and data selection lines.

In the embodiment, control lines (Φ6) are shared by the switches 5,5', and these lines are densely disposed in the same direction as that of the data control lines WL1 through WL16. Therefore, in order to form the data transfer switches 5,5', these may be disposed by adding only a connection of the gate electric wire and the source/drain diffusion layer to the prior art example, such problems such as a difficulty in processes and an increase in production cost resulting from addition of a wire layer to the source line do not exist. Also, in comparison to the prior art example, the cell array portion does not increase any area in the direction of data selection lines, and it enables a straight layout. The characteristic with respect to the layout can be enjoyed where structures shown in FIG. 4(a), FIG. 4(b), and FIG. 4(c) are used for the data selection line switches 5,5'.

Also, if a memory cell unit including a plurality of non-volatile memories is used as a memory cell unit 3, with respect to a plurality of writing data columns, it is preferable that the same columns in the memory cell matrixes, for example, a data control line WL1 of the memory cell unit a12 and a data control line WL1 of the memory cell unit a21 are selected. In the prior art example, since the same columns in the memory cell matrixes are connected in parallel, no decoder is additionally required with respect to the data selection line by selecting the data control lines as described above, wherein by controlling the gate control lines SL1 through SL4, it is possible to carry out writing in a plurality of columns.

Figure 6:
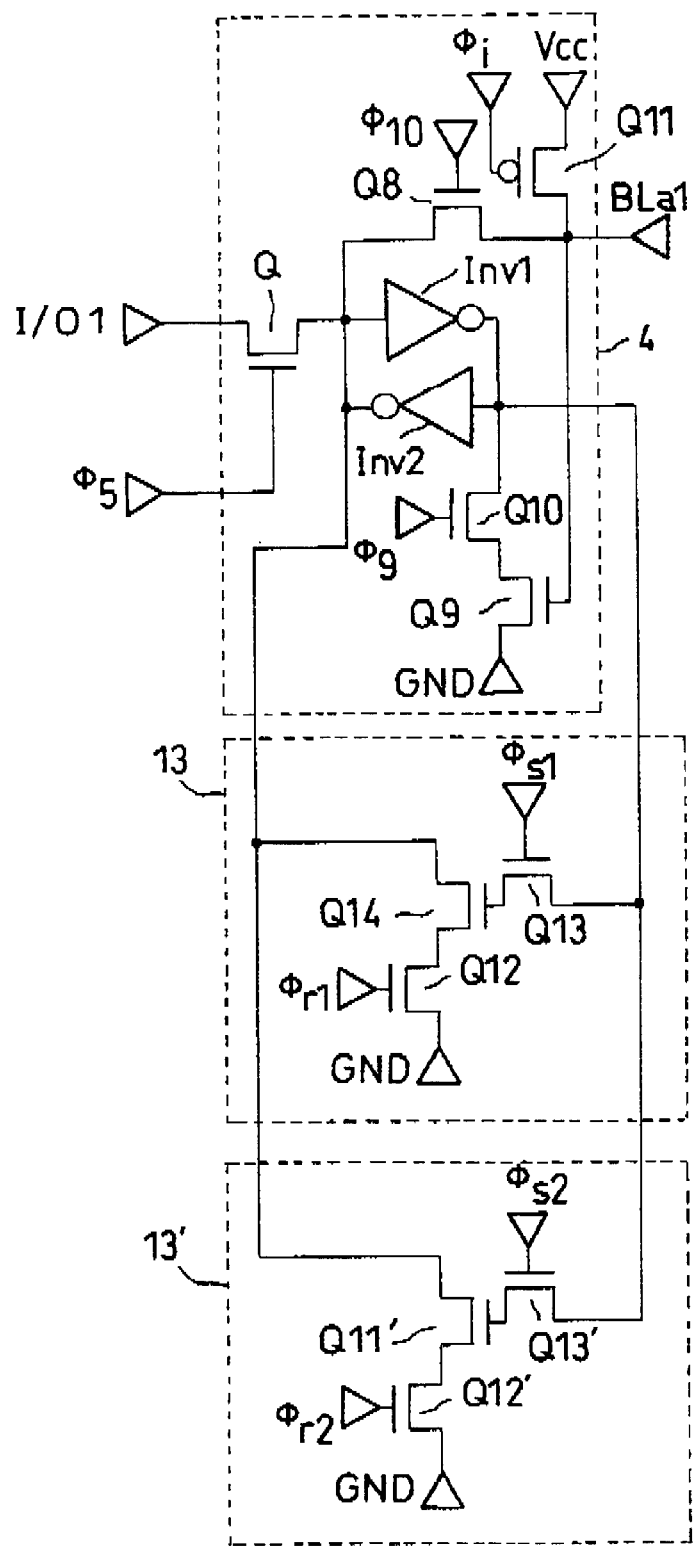
FIG. 6 is a circuit configuration showing a detailed example of a data writing latch used for the first embodiment.

FIG. 6 shows a circuit example of a data writing latch 4 according to the preferred embodiment. As for 4', the description thereof is sufficient by only replacing BLa1 by BLb1, and I/O1 by I/O2. Therefore, overlapping description thereof is omitted here. In FIG. 6, Inv1 and Inv2 indicate cross-coupled inverters, two of which constitute a flip-flop. The flip-flop functions as a provisional memory latch which holds written data and read data.

Input of the Inv1 is connected to the input/output terminal I/O1 via a transistor Q7, and Φ5 adjust the timing of inputting and outputting the data given to the I/O1. Further, the Inv1 is connected to the data transfer line BLa1 via the transistor Q8, and Φ10 adjusts the timing of outputting written data. Input of the Inv2 is connected to the source or drain electrode of a transistor Q10 that adjust the timing of latching the read data.

Also, the other end of the source or drain electrode in the transistor Q10 is connected to the source or drain electrode of a transistor Q9 that is a sensing amplifier. still further, the other end of the source or drain electrode in the transistor Q9 is connected to GND, and the input of the transistor Q9 is connected to the data transfer line BLa1. Also, a p-type MOSFET that is a transistor Q11 is connected to the data transfer line BLa1, wherein the timing thereof is adjusted by Φ1 so that the p-type MOSFET becomes a current source that provides a read current to the data transfer line BLa1 when reading from a memory cell.

These circuit blocks carry out data writing latching and reading verification actions. The configuration and actions described above are referred to in, for example, Japanese Unexamined Patent Publication No. 7-182886. In this case, the number of transistors included in the circuit block 4 corresponds to the area enclosed by broken lines in FIG. 6 and is at least nine.

On the contrary, the number of transistors included in a data transfer line switch 5 contained in the example in FIG. 4 is three at maximum. The total number of transistors in the dynamic latch circuits 13,13' and the data transfer line switch 5, which will be described later, nine at maximum. Further, the number of transistors of the circuit block 4 including a sensing amplifier becomes as shown below. In addition, since, in the circuit shown in FIG. 6, it is necessary that a sensing transistors of Q9, whose threshold fluctuation is small, is used, it is necessary to use a gate length and channel width greater by several times than the gate length and channel width of the other transistors Q12, Q13, Q7, which are the minimum design dimensions. Therefore, the circuit area can be made smaller in using a circuit of the data transfer line switch 5 as shown in FIG. 4 than in providing a plurality of sensing amplifier circuit blocks 4 in FIG. 6.

Also, in the preferred embodiment, a circuit 13 and a circuit 13' are newly formed in the data writing latch 4 in FIG. 6. These circuits are circuits that hold the initial writing data in the first and second columns, corresponding to the verification writing system. In the circuit block 13, the Inv1 output is connected to the gate electrode of the transistor Q14 via the transistor Q13, and Φs1 adjusts the timing of holding the output voltage of the Inv1 at the Capacitance of the transistor Q14 gate electrode. In addition, the Inv1 input is connected to the source or drain electrode of the transistor Q14.

The other end of the source or drain electrode of the transistor Q14 is connected to one end of the source or drain electrode of the transistor Q12. Also, the other end of the source and drain electrode of the transistor Q12 is connected to GND. The gate electrode of the transistor Q12 is connected to Φr1 which adjust the timing of outputting the held data. Herein, where the Φs1 is lowered from Vcc to GND, the output of the Inv1 is latched in the gate electrode of the transistor Q14. The sequence is hereinafter called "Data Store".

Further, where the Inv1 input is Vcc, if Φr1 is boosted from GND to Vcc, an inversion output of data stored in the transistor Q14 is inputted into the Inv1 via the source or drain electrodes of the transistor Q12 and transistor Q14. Therefore, after the Φi is made into GND and BLa1 is charged to Vcc, a Vbc pulse is applied to Φ10 from the GND potential, the Inv1 input node is charged to Vcc, and a Vcc pulse is applied to Φr1 from the GND potential, whereby voltage that is equal to the voltage obtained in the Inv1 input when data is stored can be acquired in the Inv1. This action is hereinafter called Data Recall. Herein, as regards the circuit 13', if the input terminal Φs1 is replaced by Φs2 and Φr1 is replaced by Φr2, the configuration of the circuit 13' is identical to that of the circuit 13. Therefore, overlapping description is omitted.

Figure 7:
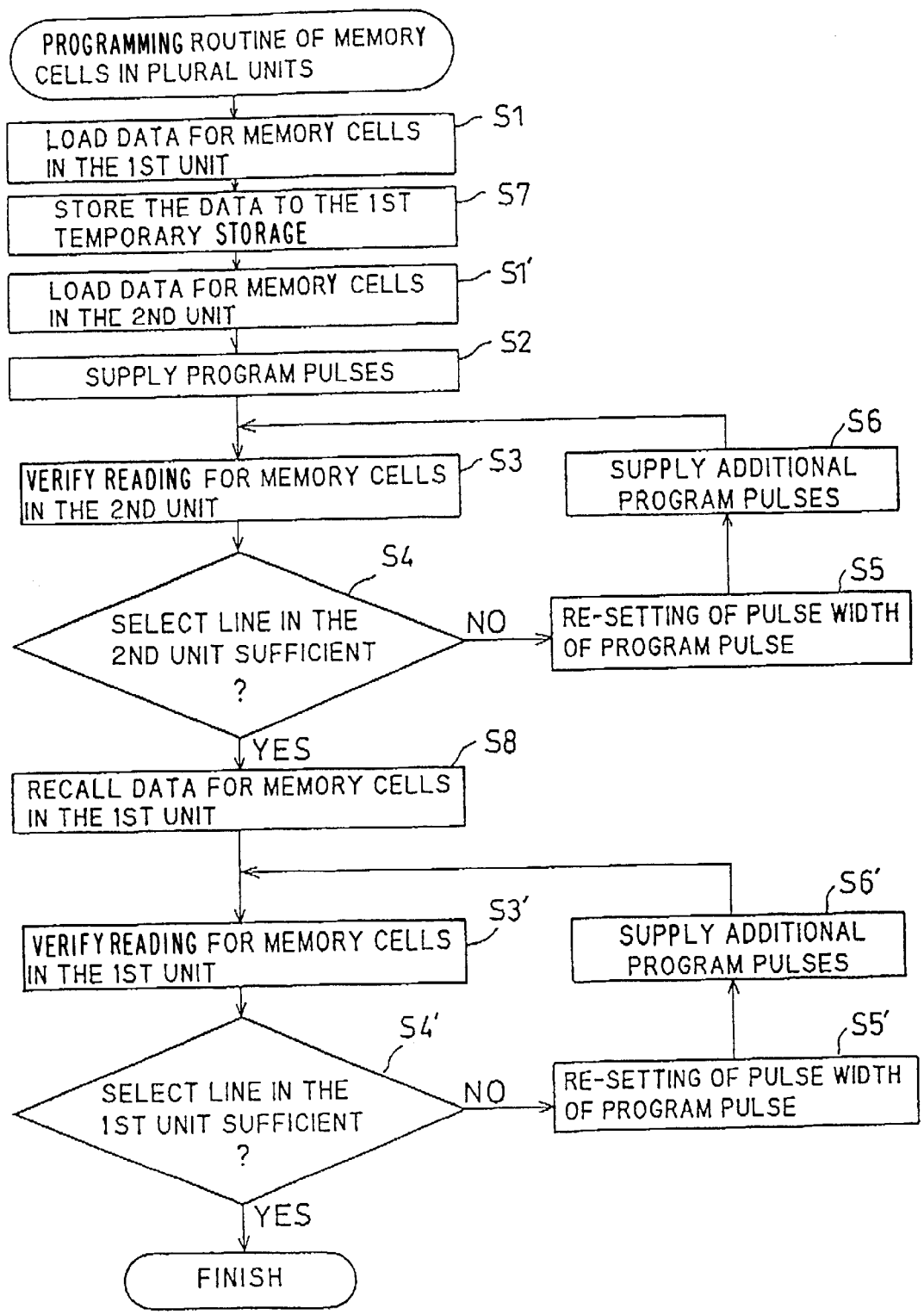
FIG. 7 is a flow chart explaining a program including a verification reading with respect to two columns by the embodiment shown in FIG. 1.

Next, FIG. 7 shows a flow chart, including a verification reading, in the case where data writing is carried out in a plurality of columns in the embodiment illustrated in FIG. 1, for example, two columns shown in the timing chart of FIG. 2. Hereinafter, it is assumed that the cell farther from the data writing latch 4 is the first column, and the cell nearer to the data writing latch 4 is the second column.

First, after the data transfer line switches 5,5' are made into a conductive state, the writing data of the first column is loaded in the latches 4,4' (S1) Also, the data in the first column are stored in the circuit 13 (S7). Next, the writing data in the second column are stored in the latches 4,4' (S1'). Thereafter, a program pulse is applied after the voltage of the data transfer lines for the first column and the second column is established (S2). The processes till now may be carried out at the timing shown in FIG. 2, wherein a Vbc pulse may be provided for Φs1 and Φs2 in the duration of time for which the writing data of a cell corresponding to BLa1 are provided.

A process of repeating verification reading and program pulse re-application with respect to the second column till termination of writing in all the memory cell units is the same as that of the verification writing with respect to the conventional first column. Therefore, the process is omitted. Here, a step (S6) of re-applying a program pulse is program pulse application with respect to the first column, wherein an already known method may be used. Also, processes after the step s3 in FIG. 7 may be performed with the data transfer line switches 5,5' made electrically continuous.

Next, after recalling the data in the first column from the circuit 13 (S8), a step of reading for verification and re-applying a program pulse is carried out until writing in all the memory cell units of the first column is completed with respect to the first column. Herein, a detailed sequence of verification reading S3' becomes as described below. After the sequence of the data recall S8, the input node of the Inv1 is Vcc in the case of a cell of "0" data, and is GND in the case of a cell of "1" data. From this state, Φ10 is set to GND, the latch and data transfer line BLa1 are separated from each other, the transistor Q11 is turned off, and the data transfer line BLa1 is charged to Vcc. Thereafter, the transistor Q11 is turned off.

Next, selection gates, and connected to the selected memory cell unit to be verified, are turned on, and verification voltage Vref is applied to the control gates of the corresponding memory cells. The Vref is determined to be intermediate between the threshold when the memory cell unit is "0", and the threshold when the memory cell unit is "1" wherein it is preferable in view of separating the "0" and "1" states that the vref is determined to be the minimum design value that is acceptable as they "1" state, whereby in the "0" state or the "1" state where data are not sufficiently written, the threshold of the corresponding memory cell is lower than the Vref. Therefore, a current flows from the corresponding memory cell into the source line, wherein the BLa1 potential is lowered to the threshold or less of the transistor Q9.

On the other hand, in the "1" state where data are sufficiently written, since the threshold of the corresponding memory cell is higher than the Vref, no current is allowed to flow into the corresponding memory cell unit, and the potential of the data transfer line BLa1 is held at Vcc. In this state, if a Vcc pulse is applied to Φ9, the input node of the Inv1 becomes Vcc in the case of "0" data cell and "1" data cell in which data are sufficiently written, and becomes GND in the case of "1" data cell in which data are not sufficiently written. The sequence till now becomes S3'.

Next, by turning on the transistor Q7, GND can be outputted to I/O1 in the input node state of the Inv1, that is, in the case where data are not sufficiently written in the I/O1, and Vcc can be outputted to I/O1 where wiring is completed in the corresponding memory cell unit. By turning off the transistor Q7 and turning on the transistor Q10 where data are not sufficiently written in the corresponding memory cell, the input node state of the Inv1 is transferred to the data transfer line BLa1. After that, although a program pulse is applied to the control gate of the corresponding memory cell unit, the voltage of the data transfer line BLa1 becomes GND where data are not sufficiently written, and in all cases other than the above, the voltage becomes Vcc, and a difference in voltage between the control gate and the data transfer line BLa1 becomes large in only the memory cell in which data are not sufficiently written, and electric charge is injected into the floating gate electrodes, whereby verification writing action can be carried out.

In the example shown in FIG. 7, only a circuit 13 for holding the first column data is required in the data writing latches in addition to a prior art sensing amplifier 4, and no circuit 13' for holding the second column data is required. Therefore, an increase in the circuit area can be suppressed. Also, in a case where a data transfer line 3 connected to one data writing latch 4 is divided into a plurality ("n") of lines (more than three), ("n"−1) circuits which are similar to the circuit 13 are required. These connections may be carried out in parallel to the output of Inv1 and Inv2 as in the circuits 13, 13'.

Figure 8:
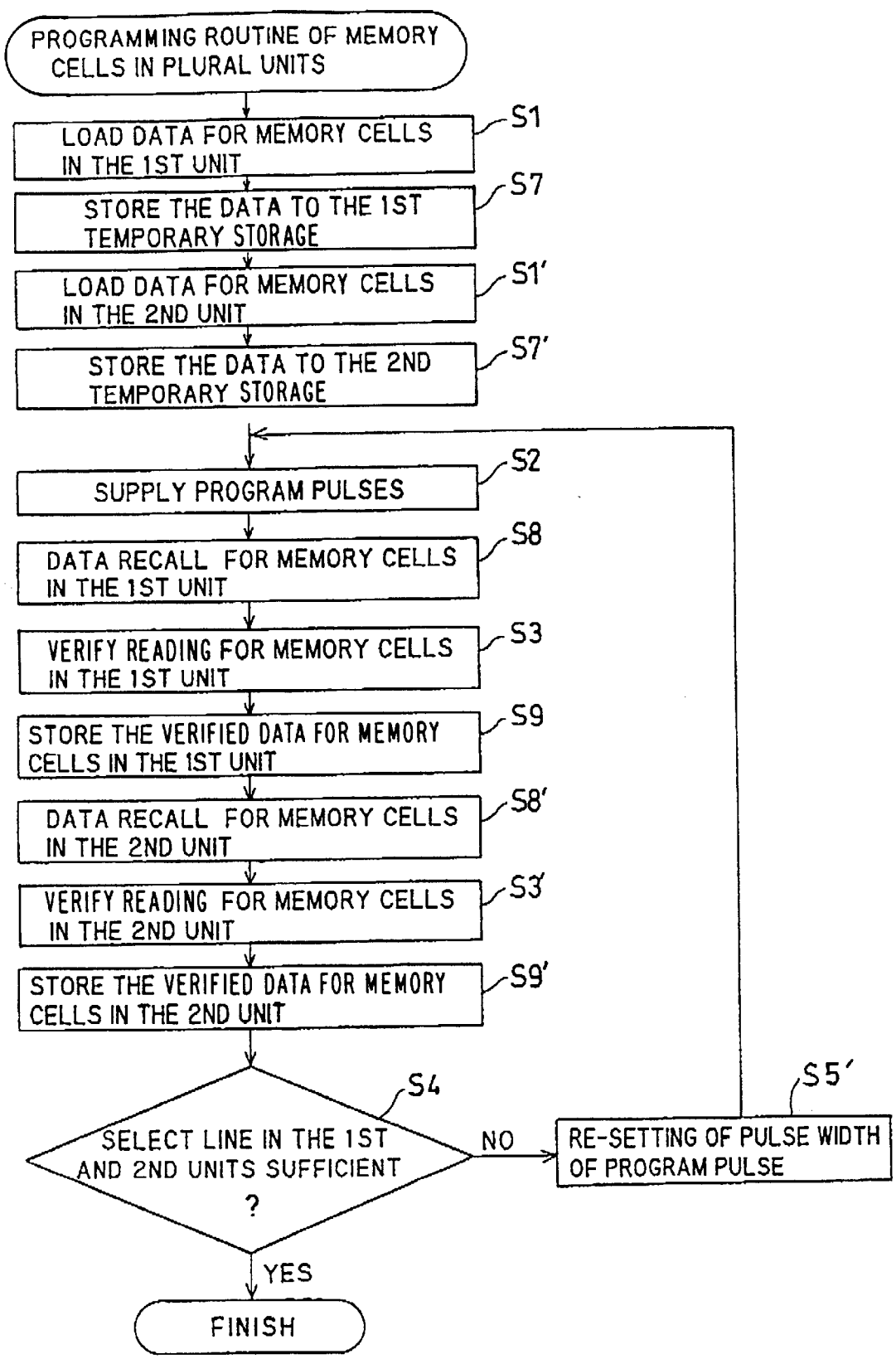
FIG. 8 is a flow chart explaining another example of a program including a verification reading with respect to two columns by the embodiment shown in FIG. 1.

FIG. 8 shows another example of the flow chart, of a plurality of lines in the configuration of the preferred embodiment in FIG. 1, with respect to program including a verification reading. In this examples as shown in FIG. 6, a plurality of circuits 13 for holding the first data and circuits 13' for holding the second data are required by the number of columns which are simultaneously programmed. However, when carrying out a verification re-writing, both the first column and second column can be simultaneously programmed. Therefore, it is possible to shorten the total programming time.

In FIG. 8, first, after the transfer line switches 5,5' are made electrically conductive, the data written in the first column are loaded in the latches 4, 4' (S1). Further, the data of the first column are stored in the circuit 13 (S7). Next, the data written in the second column are loaded in the latches 4, 4' (S1'). In addition, the data in the second column are stored in the circuit 13' (S7'). Thereafter, after the voltage of the data transfer lines of the first column and the second column is established, a program pulse is applied (S2). The timing of these steps may be carried out in accordance with the timing described with reference to FIG. 2.

Next, after the data of the first column are recalled from the circuit 13 (S8), verification reading (S3) is carried out with respect to the first column, wherein GND is output to I/O1, BLa2 and BLa1 in, for example, FIG. 1, with respect to the cells for which re-writing is necessary with "1" data, and Vcc is outputted thereto with respect to the cells for which re-writing is not required. After that, with the data transfer line switches 5,5' turned off, the data transfer line BLa2 and data transfer line BLb2 are separated from the data transfer line BLa1 and data transfer line BLb1, and these are made floating (S9).

Next, verification reading (S3') is carried out with respect to the second column after the data of the second column is recalled from the circuit 13' (S8'), GND is output to I/O1 and BLa1 in, for example, FIG. 1, with respect to the cells for which re-writing is necessary with "1" data, and Vcc is outputted thereto with respect to the cells for which re-writing is not required (S9'). Herein, if, for example, the I/O1 terminal is precharged to Vcc before the sequence S9, and the transistor Q7 is turned on by the sequences S9 and S9', the I/O1 electric charge is discharged through the transistor Q7 in a case where there is at least a cell for which re-writing is required with "1" data. Therefore, in a case where the potential of the I/O1 is made lower than the Vcc after the sequence S9 is finished, even though a plurality of circuits 4 and 4' are connected to the I/O1, it can be judged that no writing is not carried out in all the memory cell units of the first column and the second column (S4).

Where no writing is carried out in all the memory cell units, a program pulse voltage and pulse width are re-established (S5'), and re-writing is performed. In the sequence in the example shown in FIG. 8, the Inv1 input is set to GND in cells for which "1" is written, and is set to Vcc in cells for which "0" is written. Accordingly, with respect to cells for which "1" is written when carrying out next verification reading, the termination of writing is always judged without depending on the number of programs to be re-written.

Herein, the number of cells for which re-writing is required with "1" data is decreased with an increase in the number of cells for which re-writing is required. The voltage drop amount due to a current, flowing through the source line, of the cell reading current, is decreased in line with an increase in the number re-writing turns. Therefore, if this method is used, since the threshold voltage drop of the "1" state drop due to the current flowing through the source line can be made larger than the Vref., the spread of the threshold of the "1" state can be made smaller.

Where the preferred embodiment is evaluated with respect to its area using a 64 M-bit HAND type EEPROM, an increase in area due to the circuit 13 is only 1% or less, and an increase in area due to the circuits 5,5' is 1% or less, and it does not accompany no large increase in the circuit area. Further, the time required for data store and data recall is, respectively, sufficiently less than 1 μs, wherein the total program time is increased by only a sufficiently small amount of time in comparison to the program pulse width which is 35 μs or so.

Also, a dynamic latch circuit 13 of FIG. 6 according to the embodiment may be used as a provisional memory where reading data to the I/O1. This is such that by adding a Vbc pulse to, for example, Φs1 after reading is carried out, inversion data of the reading data are stored in the gate electrode of the transistor Q14. Where reading the data in the I/O1, a data recalling may be performed. The read data are provisionally stored in the latch circuit 13. And, the sensing amplifier 4 can begin to perform reading of the memory cell units.

On the contrary, in the prior art example, since the sensing amplifier 4 does not include a provisional storing member, if a plurality of sensing amplifier are formed, the next reading could not be commenced unless data in all the sensing amplifier are transferred to a peripheral device. Therefore, the embodiment can carry out reading at a higher speed than the prior arts.

[Embodiment 2]

Figure 9:
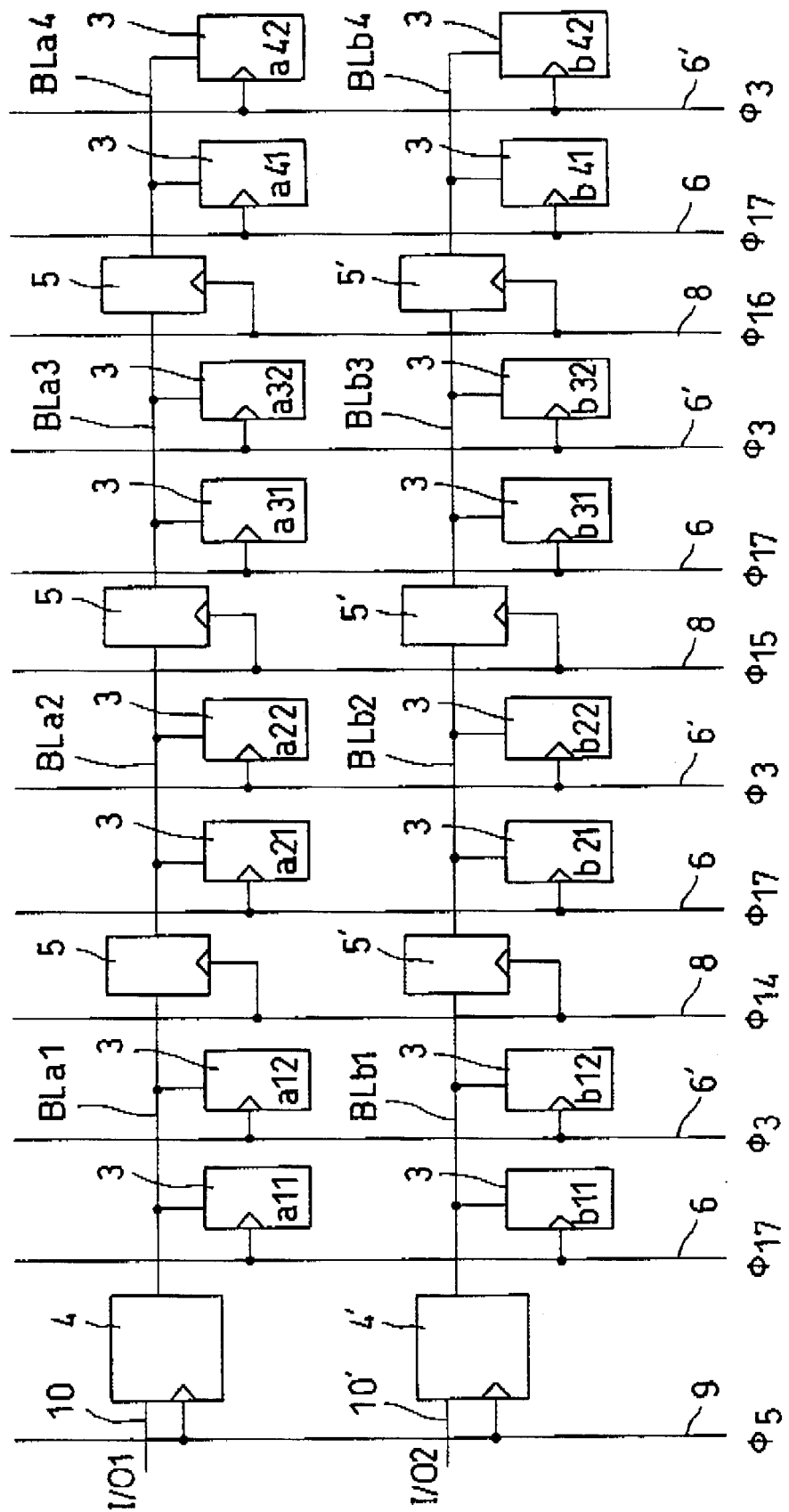
FIG. 9 is a block diagram showing a circuit configuration of a non-volatile semiconductor memory according to a second embodiment.

FIG. 9 is a block view showing a non-volatile semiconductor memory according to the second preferred embodiment of the invention, which particularly shows a memory cell matrix, and a circuit configuration construction of its peripheral major parts.

In comparison with the first preferred embodiment, this embodiment shows such a structure in which the data transfer line is divided into four divisions, and simultaneous writing can be carried out by one program pulse with respect to, for example, four memory cell units a11, a21, a31, and a41. Also, parts which are identical to those in FIG. 1 are given the same reference numbers, and overlapping detailed description thereof is omitted herein.

In FIG. 9, BLa1, BLa2, BLa3, BLa4, BLb1, BLb2, BLb3 and BLb4 indicate data transfer lines. In addition, in this case, reference number 6 indicates a data selection line for which writing is carried out. Reference number 6' indicates a data selection line for which no writing is carried out. These data selection lines 6,6' are, respectively, disposed in the direction orthogonal to the data transfer lines. Reference number 3 indicates a memory cell unit comprising a non-volatile memory cell and is formed at the intersection between the data transfer line and data selection line. A control input of the memory cell unit 3 is connected to the data selection line, and data input/output terminal of the memory cell unit 3 is connected to the data transfer lines. Also, a memory cell unit is connected to both the data transfer lines BLax (x=1,2,3,4) and data transfer lines Bulb (x=1,2,3, and 4).

Latches 4,4' which provisionally hold writing data are, respectively, formed at one end of the data transfer lines BLa1 and BLb1. The latches 4,4' is concurrently used to function as a sensing amplifier circuit to read out data of the memory cell units 3. Still further, the latches 4,4' are, respectively, connected to the data lines 10,10' which connect the writing data and reading data to a peripheral circuit. Both latches 4, 4' are connected to signal lines 9 by which the timing for latching the data is established. One end of the input/output terminals at the first data transfer line switches 5,5' is connected to one end where the latches 4, 4' of the data transfer BLA1 and BLb1 are not formed.

The other end of the input/output at the first data transfer line switches 5,5' is connected to one end of the data transfer lines BLa2 and BLb2. Further, one end of the input/output terminal at the second data transfer line switches 5,5' is connected to the other end of the data transfer lines BLa2 and BLb2. One end of data transfer lines BLa34 and BLb3 is connected to the other end of the input/output terminal of the second data transfer line switches 5,5'. Also, one end of the input/output terminal of the third data transfer line switches 5,5' is connected to the other end of the data transfer lines BLa3 and BLb3. And, one end of the input/output terminal of the third data transfer line switches 5,5' is connected to the other end of the data transfer lines BLa4 and BLb4.

Still further, the first data transfer line switches 5,5' are, respectively, connected to signal lines 8 which control connections of the data transfer lines adjacent to each other in the direction of row. As well, the second and third data transfer line switches 5,5' are, respectively, connected to signal lines 8 which control connections of the data transfer lines adjacent to each other in the direction of row. It is preferable, in view of reducing the cell area without increasing the number of wiring layers, that these signal lines 8 are disposed in the same direction as that of the data selection lines. Also, clock generation circuits 11 are provided, which output signals to these signal lines 8,9 and data selection lines 6, 6' to adequately perform the timing thereof.

In this embodiment, by turning off the data transfer lines, it is possible to independently apply potentials of the data transfer lines BLa1, BL2, BLa3, and BLa4 in compliance with the writing data. Therefore, writing can be simultaneously carried out in four memory cell units a11, a21, a31 and a41, that is, memory cell units connected to the respective data transfer lines by a data transfer line segment, for example, one program pulse.

Figure 10:
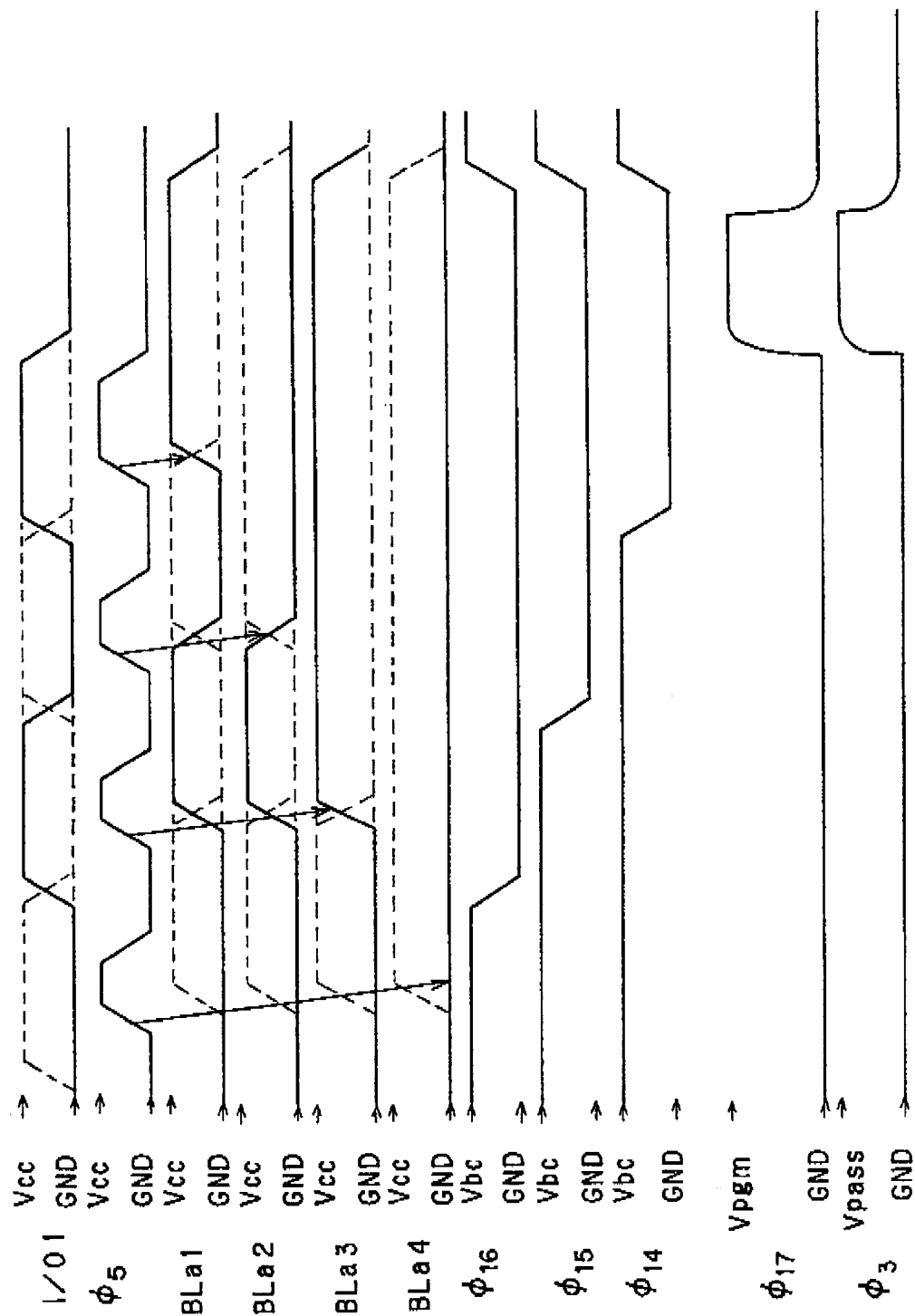
FIG. 10 is a timing chart in a case where data is written in four columns by the second embodiment.

FIG. 10 shows a timing chart based on which writing can be carried out in a plurality of columns, for example, four columns by the embodiment example illustrated in FIG. 9. FIG. 10 shows a case where "0" is written in the memory cell unit a11, "1" is written in the memory cell unit a21, "0" is written in the memory cell unit a31, and "1" is written in the memory cell unit a41. It is assumed that any data of the memory cell units in which writing is in an attempt to be written are already erased by, for example, a method for removing electric charges of the floating gates, and that the memory cell units are in a "0" state. Also, as regards the I/O2 terminal, a detailed description thereof is omitted because the writing can be carried out at similar timings as in FIG. 1.

First, in FIG. 10, voltage GND corresponding to writing data "1" of the memory cell unit a41 is applied to the peripheral current input/output terminal I/O1. Also, in FIG. 10, the writing data status described herein is illustrated by solid lines and the inverted writing data status thereof is illustrated by broken lines. Subsequently, control inputs Φ14, Φ15 and Φ16 of the data transfer line switches are made into Vbc while the data transfer lines BLa1, BLa2, BLa3 and BLa4 are made continuous (connected). After that, the voltage of Φ5 is changed from GND to Vbc, and Φ10 is changed from GND to Vcc, wherein the data I/O1 are outputted to the data transfer line BLa1.

In the embodiment, a case is illustrated, where since the embodiment is provided with only a few circuit elements, and can reduce the area thereof, data can be latched where the voltage of the signal line 9 is set to off, that is, is made into GND. The voltage of the data input/output line 10 is transmitted to the data transfer line as they are where the voltage is made into Vcc. For example, an edge trigger type data latch circuit may be used in the data writing latch as a circuit for latching data at a rise edge of the signal line 9. It is preferable that the voltage of the data transfer lines can be stabilized to the writing voltage even though the I/O1 changes. At this time, since all the data transfer line switches are turned on, the data transfer lines BLa2, BLa3 and BLa4 are set to the same potential as that of BLa1.

Next, after waiting for that the data transfer line BLa4 is charged or discharged to appointed potential Vcc or GND in writing data, the Φ16 potential is made into GND, and the third data transfer line switch 5 is interrupted. The timing of interruption is determined to come before the timing of a control signal 9, at which a data voltage differing from that of the data transfer line BLa4 is transmitted to the data transfer line BLa3. Thereby, since the data transfer line BLa4 is electrically floated, the voltage established before turning off the data transfer line switch 5 can be maintained.

Next, voltage Vcc corresponding to the writing data "0" of the cell a31 is applied to the peripheral current input/output terminal I/O1. Subsequently, the voltage Φ5 is boosted, and the data voltage of I/O1 is transmitted to the data transfer lines BLa1, BLa2 and BLa3. Next, after waiting for that BLa3 is charged or discharged to an appointed voltage Vcc or GND in writing data, the Φ15 potential is made into GND, and the second transfer line switch 5 is interrupted. The timing of interruption is determined to come before the timing of a control signal 9, at which a data voltage differing from that of the data transfer line BLa3 is transmitted to the data transfer line BLa2. Thereby, since the data transfer line BLa3 is electrically floated, the voltage established before turning off the data transfer line switch 5 can be maintained.

Next, voltage GND corresponding to the writing data "1" of the cell a21 is applied to a peripheral current input/output terminal I/O1. Subsequently, Φ5 voltage is boosted, and the data voltage of I/O1 is transmitted to the data transfer line BLa1 and BLa2. Next, after waiting for that the data transfer line BLa2 is charged or discharged to appointed potential Vcc or GND in writing data, the Φ14 potential is made into GND, and the first data transfer line switch 5 is interrupted. The timing of interruption is determined to come before the timing of a control signal 9, at which a data voltage differing from that of the data transfer line BLa2 is transmitted to the data transfer line BLa1. Thereby since the data transfer line BLa2 is electrically floated, the voltage established before turning off the data transfer line switch 5 can be maintained.

Next, voltage Vcc corresponding to the writing data "0" of the memory cell unit a11 is applied to the peripheral current input/output terminal I/O1. Continuously, the Φ5 voltage is boosted, and the data voltage of I/O1 is transmitted to the data transfer line BLa1. By the sequence described above, the data transfer lines BLa1, BLa2, BLa3, and BLa4 are, respectively, established to a voltage corresponding to the writing voltage.

Next, after waiting for the data transfer line BLa1 being charged to an appointed voltage in writing data for the duration of time, for example, from 1 ns to 1 μs, a voltage pulse is applied so that the potential of the data control line 6 connected to the memory cell unit in which data are written becomes a program voltage Vpgm. At this time, the voltage of data control line 6' for which no writing is carried out is set to potential Vpass.

After the data writing pulse is applied, the potential of Φ14, Φ15, and Φ16 are made into Vcc, and the data transfer line switches 5,5' are made continuous (connected). This is because high-speed reading of data from the memory cell unit 3 is enabled in a case where a subsequent reading is carried out.

By the sequence, it is possible to write data in four columns by one program pulse with respect to a plurality of memory cell units connected to a sensing amplifier. In the embodiment, since writing can be simultaneously carried out in four memory sub blocks, it is further shorten the programming time in comparison to the first preferred embodiment. Also, in this embodiment, where it is assumed that the program pulse time is made two times, the writing current per cell can be reduced to half (½) and the total programming time can be reduced to half at maximum. Therefore, it is possible to achieve both reduction in the writing current in cells and reduction in the total programming time.

(Embodiment 3)

Figure 18:
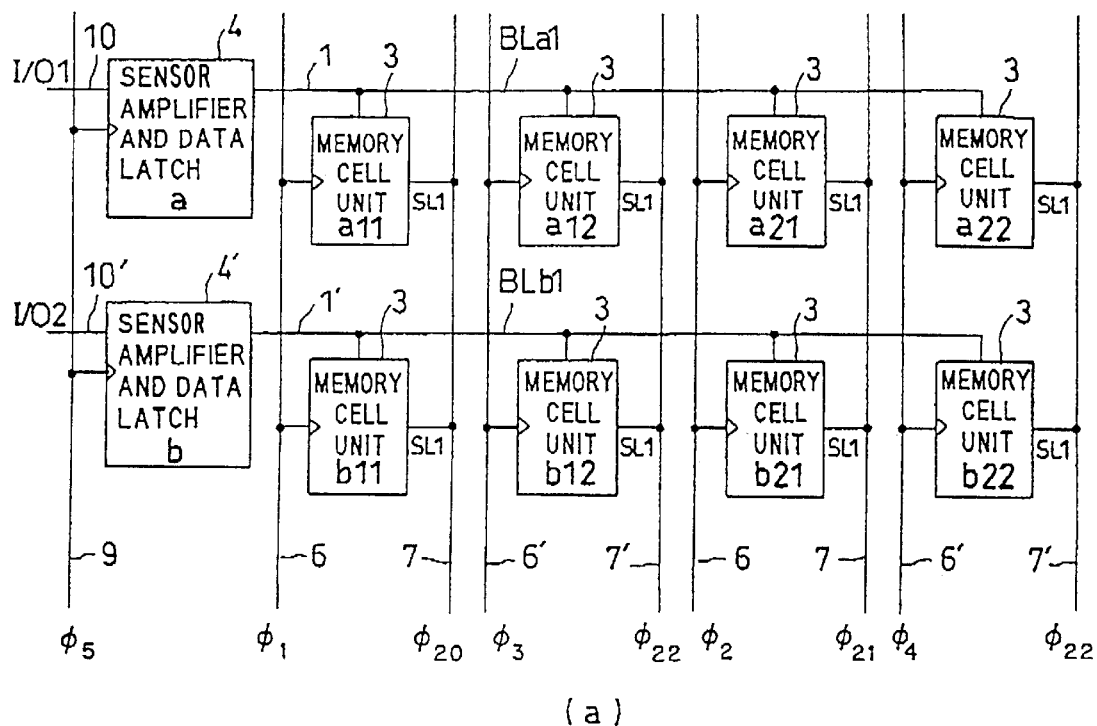
FIGS. 18a–18b are block diagrams showing a circuit configuration of a non-volatile semiconductor memory according to a third embodiment.
Figure 18:
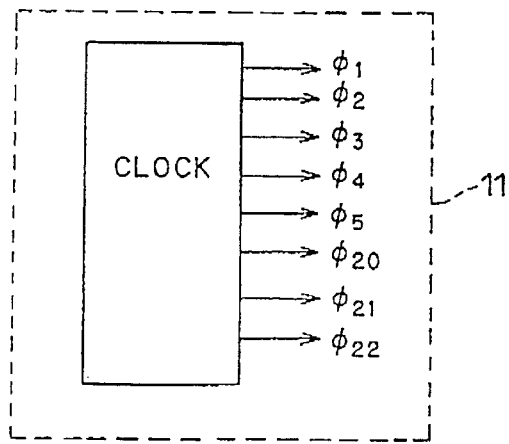

FIG. 18 shows a third preferred embodiment. In this embodiment, in comparison to the first embodiment, a selection transistor Q1 shown in FIG. 3 is used as a switching element. Such a structure is displayed, which can simultaneously carry out writing in four memory cell units, for example, a11, a21, b11, and b21, by one program pulse. That is, the respective cell blocks take a role of accumulating electric charge, which becomes data, instead of data transfer lines of the first embodiment, Also, parts which are identical to those in FIG. 1 are given the same reference numbers, and overlapping detailed description thereof is omitted.

FIG. 18 is a circuit block diagram of a non-volatile memory according to the third embodiment of the invention. The non-volatile memory illustrated in FIG. 18 is such a structure in which switching elements between the data transfer lines are removed. Further, control lines SL1 of selection transistors are connected to the respective memory cell units 3. The control lines SL1 are connected to the control lines 7,7'. It is preferable in view of decreasing the cell area without increasing the number of wiring layers that these control lines 7,7' are disposed in the same direction as that of the data selection lines 6,6'.

Further, a clock generation circuit 11 which adequately adjusts the timing and outputs a signal is formed at the control lines 7,7' and data selection lines 6,6'. Here, in this case, the control line 7' indicates a control line SL1 of the memory cell unit 3, which is not selected in writing, and the control line 7 indicates the control line SL1 of the memory cell unit 3, which is selected in writing.

In this embodiment, by turning off the selection transistors of the memory cell units 3 when applying a program pulse, the potential written in the memory cell units 3 is maintained in a floating state by capacitance of the memory cell units 3, and can be applied independently in the respective memory cell units. Therefore, the memory cell units connected to the respective data transfer lines can be simultaneously written in two columns of memory cell units a11, a21 or b11, b21 by a data transfer line segment, for example, one program pulse.

Figure 19:
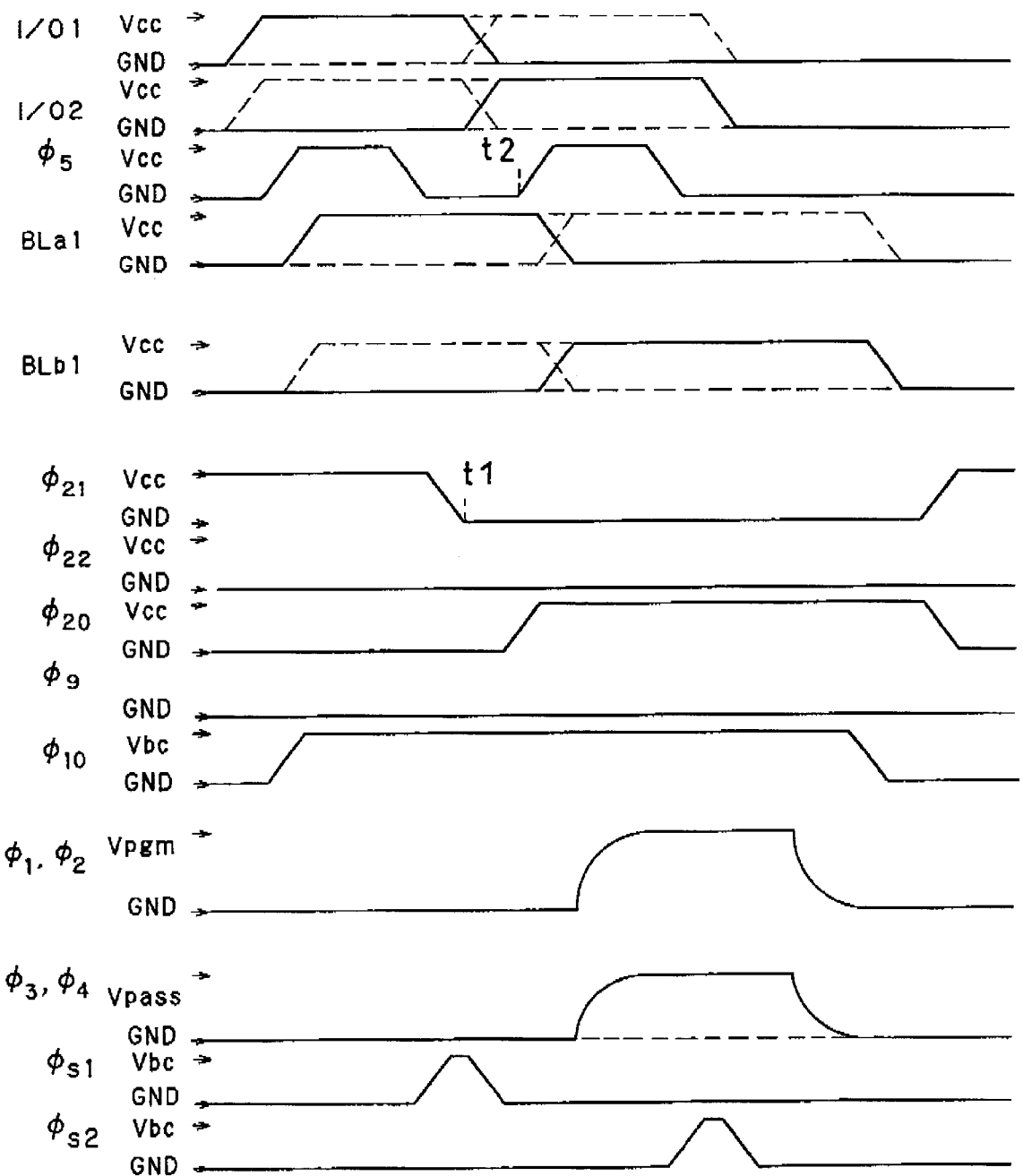
FIG. 19 is a timing diagram in a case where data are written in two columns by the third embodiment.

FIG. 19 is a timing diagram of writing data in a plurality of columns, for example, four columns, by a structure shown in FIG. 18, wherein timings which are identical to hose in FIG. 2 are omitted.

FIG. 19 shows a case where "0" is written in the memory cell unit a21, "1" is written in the memory cell unit b21, "1" is written in the memory cell unit a11, and "0" is written in the memory cell unit b11.

First, voltage, that is, Vcc and GND, corresponding to the writing data of the memory cell unit a21 and memory cell unit b21 is applied to the peripheral current input/output terminals I/O1 and I/O2. Herein, Vcc is provided as the voltage corresponding to "0" data, and 0V is provided as the voltage corresponding to "1" data.

Also, FIG. 19 shows a writing data status by solid lines, and shows an inverted writing data status by broken lines.

The drawing shows that since the circuit elements can be smaller, the signal line 9 is turned off, that is, is made into GND and data is latched and it make Vcc, the voltage of the data input/output line 10 is transmitted to the data transfer line 1. A circuit which can latch data at a fall edge of the signal line 9, for example, an edge trigger type data latch circuit may be used as the circuits 4, 4'. The circuit is preferable in view of stabilizing the voltage of the data transfer line to the voltage of the writing data even though I/O1 and I/O2 change.

Also, after the Φ21 voltage is made into Vcc and the selection gates included in the memory cell unit a21 and memory cell unit b21 are made continuous (connected), the Φ5 voltage is boosted, and data of I/O1 and I/O2 are outputted into the data transfer lines BLa1 and BLb1, and the data are latched by lowering the Φ5 voltage. At this time, since the data transfer line switches are turned on, the channel potential of the memory cell unit a21 and memory cell unit b21 is made into the same potential as that of the data transfer line BLa1 or BLb1.

Next, after waiting for that the data transfer lines BLa1 and BLb1 are charged or discharged to an appointed potential Vcc in writing data or GND, the Φ21 potential is made GND, and the selection gates included in the memory cell units a21 and b21 are turned off. The timing (t1) of interruption is made prior to the timing (t2) of a control signal, at which differing data voltage is transmitted to the data transfer line BLa1. Herein, since the channel voltage of transistors of the memory cell units a21 and b21 are electrically floated, the established voltage can be maintained before the selection transistors included in the memory cell units a21 and b21 are turned off.

Next, Φ20 potential is made into Vcc, and the selection transistors included in the memory cell units a11 and b11 are made conductive (connected). Further, voltages corresponding to the writing data of "1" and "0" of the memory cell units a11 and b11, 0V and Vcc, are applied to the peripheral current input/output terminals I/O1 and I/O2.

In addition, the Φ5 voltage is boosted, and the data voltage of the peripheral current input/output I/O1 and I/O2 is transmitted to the data transfer lines BLa1 and BLb1. By the sequence described above, voltage corresponding to the writing data is established at the channel potential of the memory cell units a21, b21, a11 and b11.

In the sequence, the Φ22 potential is made into GND and the selection transistors included in the non-selected memory cell units, for example, memory cell units a12, b12, a22 and b22 are not conductive, whereby erroneous writing can be prevented from occurring.

A sequence coming after the sequence of applying data writing pulses is the same as that in FIG. 1. Therefore, overlapping description thereof is omitted.

In the embodiment, any selection circuits 5,5' are not needed with the features of the first embodiment secured, the circuit area can be further reduced than in the first embodiment. Also, there is not necessarily need to transfer data from the memory sub block farthest from a sensing amplifier in writing, but it is possible to transfer data with respect to the memory cell large block in any optional order. Therefore, it is not necessary to provide any order replacement circuit or process between memory sub blocks of writing data, and a higher speed writing sequence can be achieved.

Figure 11:
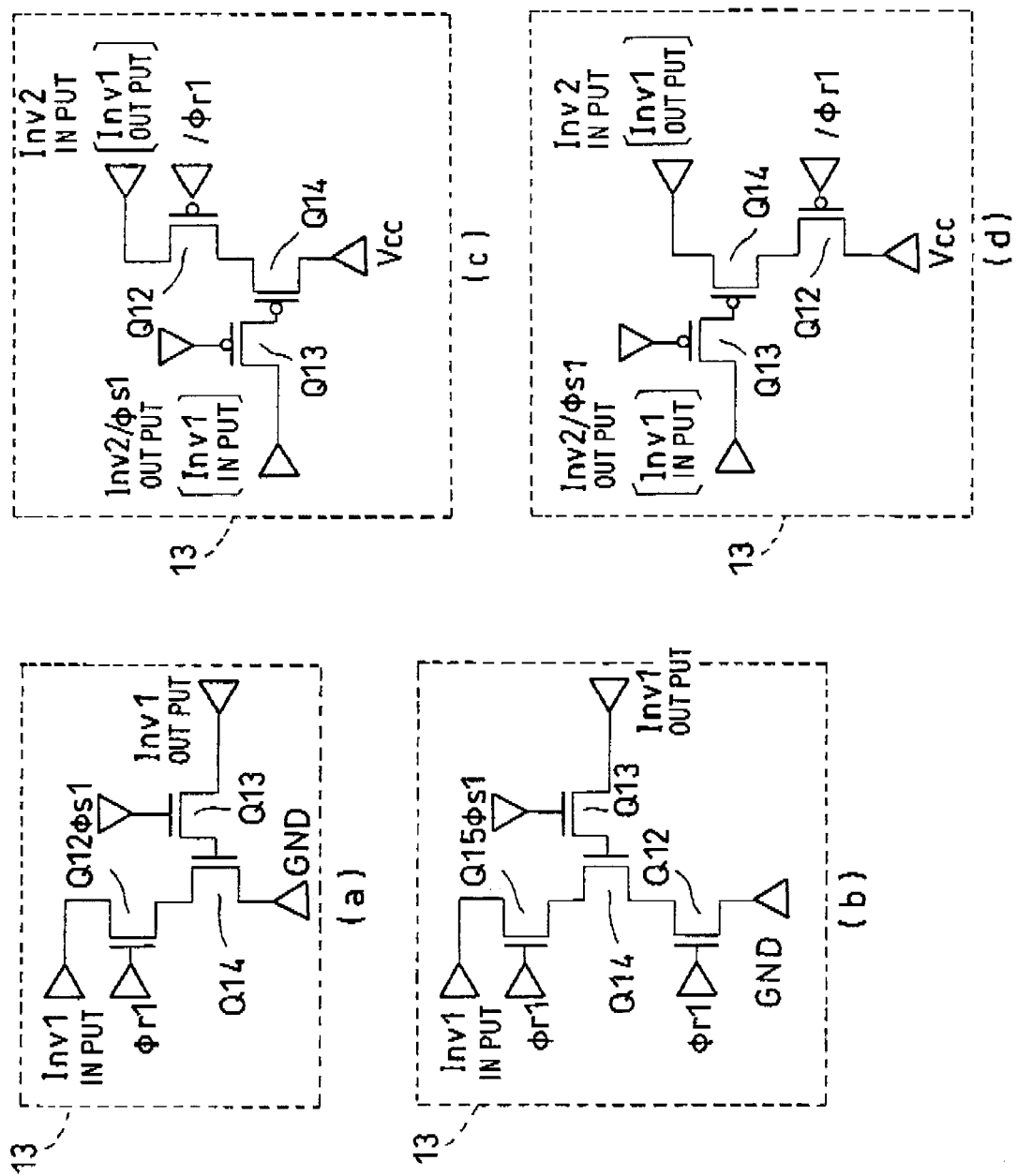
FIGS. 11a–11d are the circuit configuration showing another example of the dynamic data holding circuit, which is to describe a modified version of the invention.
Figure 12:
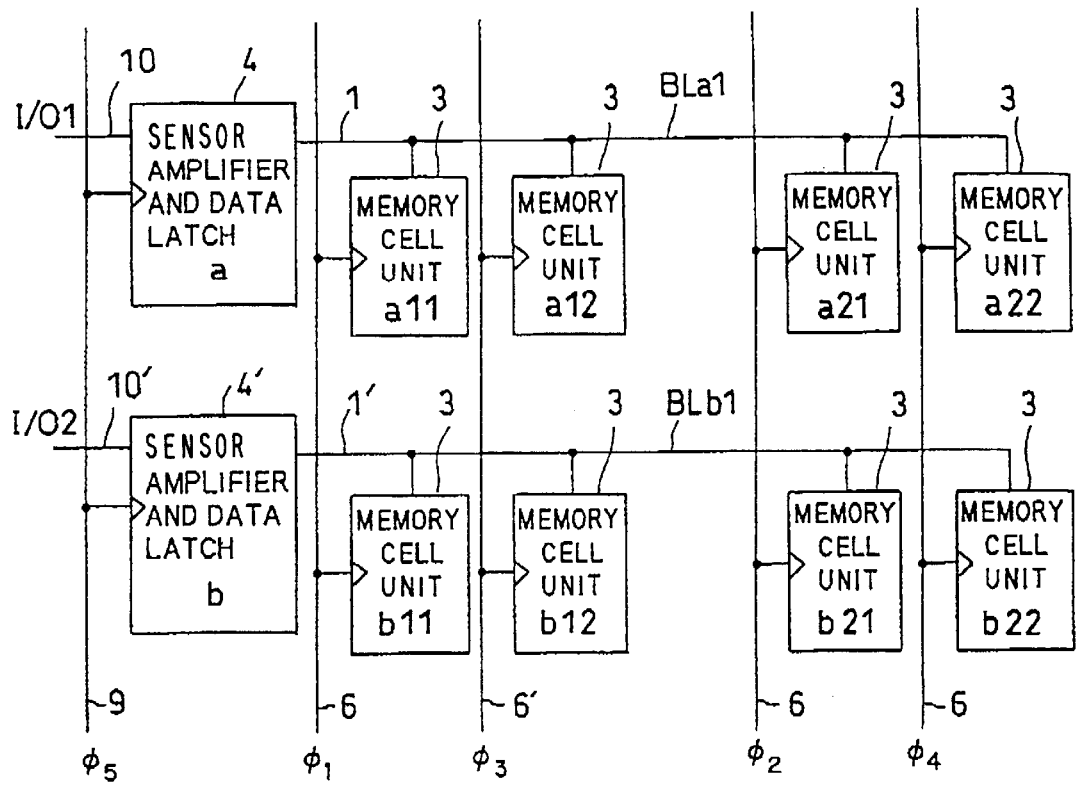
FIGS. 12a–12b are the block diagram showing a circuit configuration of a prior art non-volatile semiconductor memory.
Figure 12:
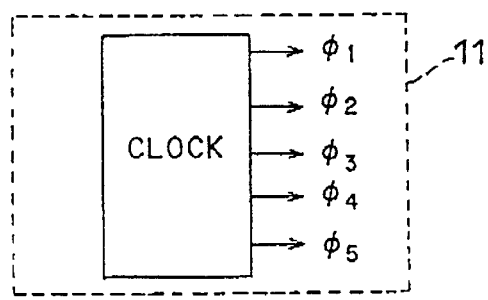
Figure 13:
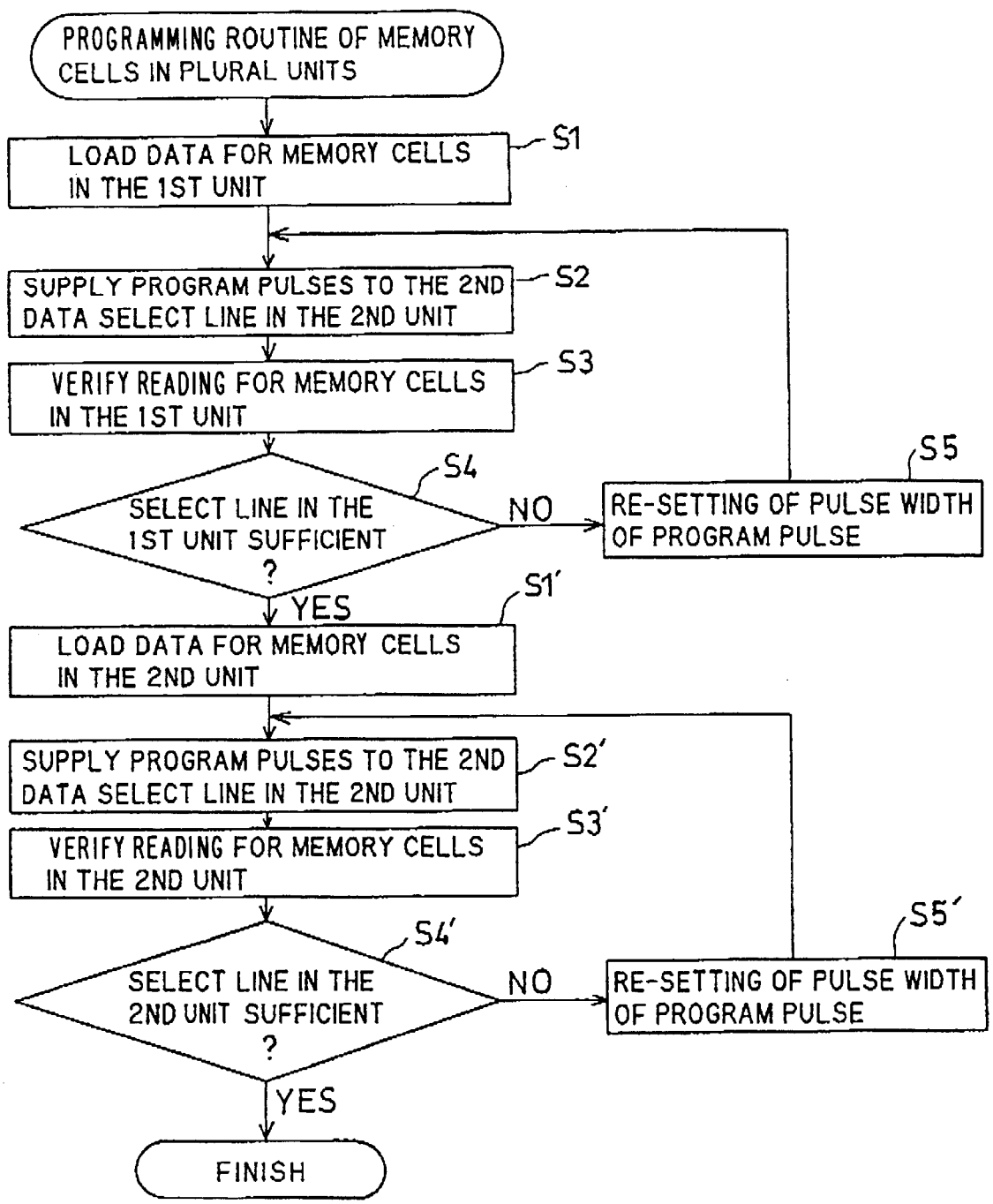
FIG. 13 is a flow chart to explain a data writing including a verification with respect to two columns by a prior art construction shown in FIG. 12.

Further, the invention is not limited to the respective embodiments described above. For example, a circuit shown in FIG. 1 may be used as the dynamic data holding circuit 13 disclosed in the first embodiments FIG. 11(a) shows that in which the connection order of transistors Q12 and Q14 of the circuit 13 in FIG. 6 is altered. Since the circuit 13 is via a transistor Q14, switching noise of Φr1 is scarcely transmitted to Inv1 and BLa1, wherein it is possible to prevent erroneous inversion of a flip-flop. On the other hand, in FIG. 11(a), since the source electrode of the transistor Q14 is grounded, electric charge accumulated in the gate electrode of the transistor Q14 can be reduced. In addition, the transistor Q14 can be turned on without fail even though the output voltage of the Inv1 is decreased, and the input of the Inv1 can be made into GND. Also, switching noise of Φr1 and Φs1 can be scarcely transmitted to the input of Inv1 by connecting the transistors Q15, Q14 and Q12 shown in FIG. 11(b) in a series. Further, FIG. 11(c) shows an example in which an n-type MOSFET configuration in FIG. 11(a) is replaced by a p-type MOSFET configuration. In this case, a /Φs1 which is an inverted signal of Φs1 is given as the gate input of the transistor Φ13, and a /Φr1 which is an invades signal of Φr1 is given as the gate input of the transistor Φ12. Further, FIG. 11(d) shows an example, in which the relationship in a series between the transistors Q12 and Q14 in FIG. 11(c) is replaced by each other.

By making the gate electrode of the transistor Q13 into GND in addition to the circuit 13 shown in FIG. 11(a) and FIG. 6, the configurations shown in FIG. 11(c) and (d) can boost the Inv1 to Vcc. Therefore, the semiconductor device can be actuated at a lower voltage power source.

Also, although n-type MISFETs are used as switching elements, the p-type and n-type can be replaced by inverting the gate input. Also, for example, an npn bipolar transistor may be used instead of the n-type MISFETs, and a pnp bipolar transistor may be also used. In a case where a bipolar transistor is used, a collector electrode is used instead of a drain electrode, an emitter electrode is used instead of a source electrode, and a base electrode is used as a gate electrode. In order to turn on, a forward voltage, which is positively pn-connected, for example, 0.6V or more, is applied by an npn transistor between, for example, the base emitter electrodes, or a forward voltage or more is negatively applied by a pnp transistor therebetween. In order to turn off, the base electrode is made into GND.

In the present embodiment, a non-volatile semiconductor element comprising an EEPROM is listed as an example. However, the construction according to the invention is a memory matrix comprising a plurality of data selection lines and a plurality of data transfer lines, wherein it is clear that the construction is effective for ant volatile or non-volatile memory element whose program speed is slow with respect to the reading speed. For example, it is needless to say that the present invention is applicable to a ferroelectric memory taking time for polarization inversion, and a ferromagnetic memory taking time for domain inversion.

Additionally, the present invention may be applicable to various modifications without departing from the spirit of the invention.

What is claimed is:

1. A non-volatile semiconductor memory device programmable plural memory units simultaneously comprising:

a first control line;

a plurality of data holders connected to the first control line;

a plurality of first data transfer lines connected to the plurality of data holders;

a plurality of first memory cell units having a non-volatile semiconductor memory cell, connected to the plurality of first data transfer lines;

a first data selection line connected to the plurality of first memory cell units;

a second control line;

a plurality of second data transfer lines;

a plurality of switching elements connected to the second control line, inserted between the plurality of first data transfer lines and the plurality of second data transfer lines, causing to electrically connect the plurality of first transfer lines with the plurality of second data transfer lines;

a plurality of second memory cell units having a non-volatile semiconductor memory cell, connected to the plurality of second data transfer lines;

a second data selection line connected to the plurality of second memory cell units, wherein when writing data, the plurality of data holders transfer data to the plurality of second data lines and then the plurality of switching elements are shut off, the plurality of first memory cell units and the plurality of second memory cell units are simultaneously selected.

2. A non-volatile semiconductor memory according to claim 1, wherein the plurality of data holders contain a flip flop formed by a semiconductor element.

3. A non-volatile semiconductor memory device according to claim 1, wherein the plurality of first memory cell units and the plurality of second memory cell units include a field effect transistor provided with at least an electric charge accumulating layer and a control gate.

4. A non-volatile semiconductor memory device according to claim 3, wherein the electric charge accumulating layer contains polysilicon or silicon nitride film.

5. A non-volatile semiconductor memory device programmable plural memory units simultaneously comprising:
- a first control line;
- a plurality of data holders connected to the first control line;
- a plurality of data transfer lines connected to the plurality of data holders;
- a plurality of first memory cell units having a non-volatile semiconductor memory cell;
- a first data selection line connected to the plurality of first memory cell units;
- a second control line;
- a plurality of first switching elements connected to the second control line, inserted between the plurality of data transfer lines and the plurality of first memory cell units, causing to electrically connect the plurality of transfer lines with the plurality of first memory cell units;
- a plurality of second memory cell units having a non-volatile semiconductor memory cell;
- a second data selection line connected to the plurality of second memory cell units;
- a third control line;
- a plurality of second switching elements connected to the third control line, inserted between the plurality of data transfer lines and the plurality of second memory cell units, electrically connecting the plurality of transfer lines with the plurality of second memory cell units by the third control line;
- wherein, when writing data, the data holder transfers data to the plurality of second memory cell units and then the plurality of first and second switching elements are shut off, the plurality of first memory cell units and the plurality of second memory cell units are simultaneously selected.

6. A non-volatile semiconductor memory device programmable plural memory units simultaneously according to claim 5, wherein the plurality of first switching elements and the plurality of first memory cell units are formed on a first well, and the plurality of second switching elements and the plurality of second memory cell units are formed on a second well.

7. A non-volatile semiconductor memory device programmable plural memory units simultaneously according to claim 5, wherein the plurality of data holder contain a flip flop formed by a semiconductor element.

8. A non-volatile semiconductor memory device programmable plural memory units simultaneously according to claim 1, wherein the plurality of second data transfer lines have a first end and a second end, the first end connected to the plurality of switching elements and the second end connected to the plurality of second memory cell units.

9. A non-volatile semiconductor memory device programmable plural memory units simultaneously according to claim 1, wherein the plurality of data holders comprising a first sensing amplifier having a first circuit provisionally holding data to be written to the first memory cell unit and a second circuit provisionally holding data to be written to the second memory cell unit.

10. A non-volatile semiconductor memory device programmable plural memory units simultaneously according to claim 9, wherein the first circuit changes digital value when the written data of the first memory cell unit is same as the data to be written to the first memory cell unit.

11. A non-volatile semiconductor memory device programmable plural memory units simultaneously according to claim 1, wherein the memory cell unit comprising a field effect transistor using an Fowler-Nordheim tunneling current for writing.

12. A non-volatile semiconductor memory device programmable plural memory units simultaneously according to claim 1, wherein the plurality of memory cell units comprising a NAND cell unit including a first select transistor, and a string of memory cell transistors coupled in series; and
- wherein one end of the string is connected to the source of a first select transistor, and the other end of the string is connected to the drain of a second select transistor.

13. A non-volatile semiconductor memory device programmable plural memory units simultaneously according to claim 1, the memory cell unit comprising a AND cell unit including a first select transistor, a second select transistor, and memory cell transistors; and
- wherein sources of memory cell transistors are connected in common, and the drains of memory cell transistors are connected in common, the drains of the memory cell transistors are connected to the source of a first selected transistor, and the sources of the memory cell transistors are connected to the drain of a second select transistor.

14. A non-volatile semiconductor memory device programmable plural memory units simultaneously according to claim 1, wherein when writing data, the plurality of switching elements is connecting, the data holder transfers data to the plurality of second data lines and then the plurality of switching elements is shut off, and the plurality of first memory cell units and the plurality of second memory cell units are simultaneously selected.

15. A non-volatile semiconductor memory device programmable plural memory units simultaneously according to claim 1, wherein the plurality of data holders, the plurality of first memory cell units, the plurality of switching elements and the plurality of second memory cell units are disposed substantially in parallel to each other in a direction of the first control line, the first data selection line, the second control line and the second data selection line respectively.

16. A non-volatile semiconductor memory device programmable plural memory units simultaneously according to claim 5, wherein the plurality of data holders comprising a first sensing amplifier having a first circuit provisionally holding data to be written to the first memory cell unit and a second circuit provisionally holding data to be written to the second memory cell unit.

17. A non-volatile semiconductor memory device programmable plural memory units simultaneously according to claim 16, wherein a first circuit changes digital value when the written data of the first memory cell unit is same as the data to be written to the plurality of first memory cell units.

18. A non-volatile semiconductor memory device programmable plural memory units simultaneously according to claim 5, wherein the memory cell unit comprising a field effect transistor using an Fowler-Nordheim tunneling current for writing.

19. A non-volatile semiconductor memory device programmable plural memory units simultaneously according to claim 5, wherein the plurality of memory cell units comprising a NAND cell unit including a first select transistor, and a string of memory cell transistors coupled in series; and wherein one end of the string is connected to the source of a first select transistor, and the other end of the string is connected to the drain of a second select transistor.

20. A non-volatile semiconductor memory device programmable plural memory units simultaneously according to claim 5, the plurality of memory cell units comprising AND cell units including a first select transistor, a second select transistor, and memory cell transistors; and wherein the sources of the plurality of memory cell transistors are connected in common, the drains of memory cell transistors are connected to the source of a first select transistor, and the sources of the memory cell transistors are connected to the drain of a second select transistor.

21. A non-volatile semiconductor memory device programmable plural memory units simultaneously according to claim 5, wherein, when writing data, the plurality of second switching elements are connecting, the plurality data holders transfers data to the plurality of second memory cell units and then the plurality of switching elements are shut off, and the plurality of first memory cell units and the plurality of second memory cell units are simultaneously selected.

22. A non-volatile semiconductor memory device programmable plural memory units simultaneously according to claim 5, wherein the plurality of data holders, the plurality of first memory cell units, the plurality of first switching elements, the plurality of second cell units and the plurality of second switching elements are disposed substantially in parallel to each other in the direction of the first control line, the first data selection line, the second control line, the second data selection line and the third control line respectively.

* * * * *